US009001585B1

(12) United States Patent
Lin et al.

(10) Patent No.: US 9,001,585 B1
(45) Date of Patent: Apr. 7, 2015

(54) DATA WRITING METHOD, MEMORY CONTROL CIRCUIT UNIT AND MEMORY STORAGE APPARATUS

(71) Applicant: Phison Electronics Corp., Miaoli (TW)

(72) Inventors: Wei Lin, Taipei (TW); Cheng-Long Low, Miaoli County (TW); Kiang-Giap Lau, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 0 days.

(21) Appl. No.: 14/188,713

(22) Filed: Feb. 25, 2014

(30) Foreign Application Priority Data

Dec. 26, 2013 (TW) .............................. 102148519 A

(51) Int. Cl.
*G11C 16/06* (2006.01)
*G11C 16/16* (2006.01)
(52) U.S. Cl.
CPC ....................................... *G11C 16/16* (2013.01)
(58) Field of Classification Search
USPC .................................................... 365/185.12
See application file for complete search history.

(56) References Cited

U.S. PATENT DOCUMENTS

2010/0325351 A1* 12/2010 Bennett ......................... 711/103

* cited by examiner

*Primary Examiner* — Huan Hoang
*Assistant Examiner* — Jay Radke
(74) *Attorney, Agent, or Firm* — Jianq Chyun IP Office

(57) ABSTRACT

A data writing method for a rewritable non-volatile memory module, and a memory control circuit unit and a memory storage apparatus using the same are provided. The method includes partitioning physical erasing units of the rewritable non-volatile memory module into a temporary area and a free area. The method also includes dynamically selecting multiple physical erasing units from the temporary area, the free area, or both the temporary area and the free area as a temporary physical erasing unit group corresponding to a logical unit and using the temporary physical erasing units to write updated data to be stored into the logical unit via a single-page mode. Accordingly, the method can effectively prevent the data error occurring due to continuously using old physical erasing units of the temporary area for temporarily storing data and the method can improve the speed and the reliability of writing data.

24 Claims, 15 Drawing Sheets

| Lower physical programming unit | Middle physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

DATA WRITING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 102148519, filed on Dec. 26, 2013. The entirety of the above-mentioned patent application is hereby incorporated by reference herein and made a part of this specification.

BACKGROUND

1. Technology Field

The present invention is directed to a data writing method and more particularly, a data writing method for a rewritable non-volatile memory module, a memory control circuit unit and a memory storage apparatus using the same.

2. Description of Related Art

Digital cameras, cell phones, and MP3 players have undergone rapid growth in recent years, so that consumers' demands for storage media have also been increased drastically. Due to having the characteristics of non-volatility of data, low power consumption, small volume, non-mechanical structure, and fast reading and writing speed, the rewritable non-volatile memory is the most adaptable memory applied in a portable electronic product, e.g., a notebook computer. A solid state drive (SSD) is a storage apparatus which utilizes a flash memory as its storage medium. Therefore, the flash memory industry has become a very popular part of the electronic industry in recent years.

According to the number of bits which each memory cell thereof is capable of storing, an NAND flash memory may be classified into a Single Level Cell (SLC) NAND flash memory, a Multi Level Cell (MLC) NAND flash memory, or a Trinary Level Cell (TLC) NAND flash memory. Specifically, each memory cell in the SLC NAND flash memory can store one bit of data (i.e., "1" or "0"), each memory cell in the MLC NAND flash memory can store two bits of data, and each memory cell in the TLC NAND flash memory can store three bits of data.

In the NAND flash memory, a physical programming unit is composed of several memory cells arranged on the same word line. Since each memory cell in the SLC NAND flash memory can store one bit of data, several memory cells arranged on the same word line in the SLC NAND flash memory correspond to one physical programming unit.

By contrast, a floating gate storage layer in each memory cell of the MLC NAND flash memory can store two bits of data, and each storage state (i.e., "11," "10," "01," or "00") includes the least significant bit (LSB) and the most significant bit (MSB). For instance, the first bit from the left of the storage states is the LSB, and the second bit from the left of the storage states is the MSB. Accordingly, several memory cells arranged on the same word line may constitute two physical programming units, and therein, the physical programming unit constituted by the LSB and the MSB of the memory cell are a lower physical programming unit and an upper physical programming unit, respectively. In particular, the speed of writing data into the lower physical programming unit is faster than writing data into the upper physical programming unit, and when a program failure occurs in the process of programming the upper physical programming unit, the data stored in the lower physical programming unit may be lost.

Similarly, each memory cell in the TLC NAND flash memory can store three bits of data, and each storage state (i.e., "111," "110," "101," "100," "011," "010," "001," or "000") includes the first bit (i.e., the LSB), the second bit (i.e., the center significant bit, CSB), and the third bit (i.e., the MSB) from the left of the storage states. Accordingly, several memory cells arranged on the same word line may constitute three physical programming units, and therein, the physical programming unit constituted by the LSB is a lower physical programming unit, the physical programming unit constituted by the CSB is a middle physical programming units, and the physical programming unit constituted by the MSB of the memory cells is an upper physical programming unit. Specifically, when programming the memory cells on the same word line, only one of merely programming the lower physical programming unit or simultaneously programming the lower physical programming unit, the middle physical programming unit and the upper physical programming unit can be selected; otherwise, the stored data may be lost.

Generally, in a memory module using the TLC NAND flash memory, due to part of the physical erasing units therein being grouped as those using the single-page mode only for operating the lower physical programming units to stimulate the operation of the SLC NAND flash memory, the lifespan (the maximum threshold of erasing number) is increased, and due to the single-page mode being only used for operating the lower physical programming unit, the writing and the reading speeds are also significantly increased. The part of the physical erasing units which simulate the operation of the SLC NAND flash memory are used as a buffer area of the memory module to temporarily store data or to store system data. However, if a great portion of the data are used for the temporarily storing operation, the erasing count of the physical erasing units in the buffer area is dramatically increased, which results in physical erasing units getting old rapidly, such that unrecoverable data error occurs in the data which is later temporarily stored therein.

In light of the foregoing, how to avoid data error occurring due to the old physical erasing units in the buffer area and improve the reliability and efficiency for the flash memory of which each memory cell is capable of storing several bits has become one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a data writing method, a memory control circuit unit and a memory storage apparatus capable of effectively extending lifespan of the memory storage apparatus.

According to an exemplary embodiment of the present invention, a data writing method for a rewritable non-volatile memory module is provided, wherein the rewritable non-volatile memory module has a plurality of physical erasing units, and each of the physical erasing units has a plurality of physical programming units. The data writing method includes at least partitioning the physical erasing units into a free area and a temporary area, receiving first data to be stored into a plurality of logical sub-units of a first logical unit, selecting physical erasing units from the plurality of physical erasing units from the temporary area, the free area or both the temporary area and the free area as a plurality of temporary physical erasing units of a first temporary physical erasing unit group corresponding to the first logical unit according to an average erasing count of the physical erasing units of the temporary area, writing the first data into the temporary physical erasing units of the first temporary physical erasing unit group by using a single-page mode and selecting a first physical erasing unit from the physical erasing units of the free area, copying the first data from the temporary physical erasing units of the first temporary physical erasing unit group to the first physical erasing unit and mapping the first logical unit to the first physical erasing unit.

According to an embodiment of the present invention, a memory control circuit unit for controlling a rewritable non-volatile memory module is provided, wherein the rewritable non-volatile memory module includes a plurality of physical erasing units. The memory control circuit unit includes a host interface configured to be coupled to a host system, a memory interface configured to be coupled to the rewritable non-volatile memory module and a memory management circuit coupled to the host interface and the memory interface. The memory management circuit is configured to at least partition the physical erasing units into a free area and a temporary area and to receive first data from the host system, wherein the host system instructs to store the first data to a plurality of logical sub-units of a first logical unit. Additionally, the memory management circuit is further configured to select physical erasing units from the plurality of physical erasing units from the temporary area, the free area or both the temporary area and the free area as a plurality of temporary physical erasing units of a first temporary physical erasing unit group corresponding to the first logical unit according to an average erasing count of the physical erasing units of the temporary area. Further, the memory management circuit is further configured to write the first data into the temporary physical erasing units of the first temporary physical erasing unit group in the single-page mode. Moreover, the memory management circuit is further configured to select a first physical erasing unit from the physical erasing units of the free area, copy the first data from the temporary physical erasing units of the first temporary physical erasing unit group to the first physical erasing unit and map the first logical unit to the first physical erasing unit.

According to an embodiment of the present invention, a memory storage apparatus is provided. The memory storage apparatus includes a connection interface unit configured to be coupled to a host system, a rewritable non-volatile memory module and a memory control circuit unit. The rewritable non-volatile memory module has a plurality of physical erasing units. The memory control circuit unit is coupled to the connection interface unit and the rewritable non-volatile memory module and configured to at least partition the physical erasing units into a free area and a temporary area. The memory control circuit unit is further configured to receive first data from the host system, and the host system instructs to store the first data to a plurality of logical sub-units of a first logical unit. Additionally, the memory control circuit unit is further configured to select physical erasing units from the plurality of physical erasing units from the temporary area, the free area or both the temporary area and the free area as a plurality of temporary physical erasing units of a first temporary physical erasing unit group corresponding to the first logical unit according to an average erasing count of the physical erasing units of the temporary area. Further, the memory control circuit unit is further configured to write the first data into the temporary physical erasing units of the first temporary physical erasing unit group by using a single-page mode. Moreover, the memory control circuit unit is further configured to select a first physical erasing unit from the physical erasing units of the free area, copy the first data from the temporary physical erasing units of the first temporary physical erasing unit group to the first physical erasing unit and map the first logical unit to the first physical erasing unit.

To sum up, the data writing method, the memory control circuit unit and the memory storage apparatus can dynamically select the physical erasing units from the plurality of physical erasing units of the temporary area, the free area or both the temporary area and the free area as the temporary physical erasing units of the temporary physical erasing unit group corresponding to the logical unit according to the average erasing count of the physical erasing units of the temporary area. Thereby, the physical erasing units of the temporary area can be prevented from error of the data stored therein occurring due to an excessively usage amount to improve reliability and efficiency of a flash memory capable of storing a plurality of bits.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the present invention.

DESCRIPTION OF THE EMBODIMENTS

Figure 1A:
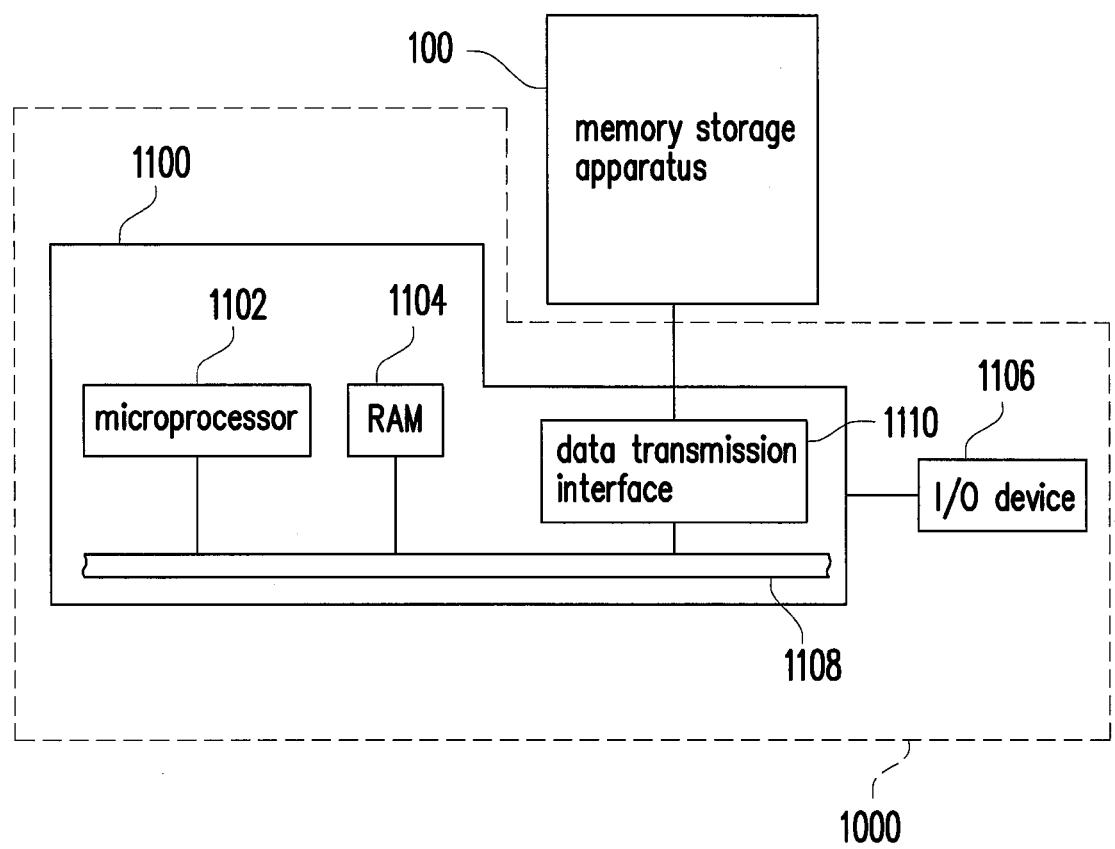
FIG. 1A is a schematic block diagram illustrating a host system and a memory storage apparatus according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1A is a schematic block diagram illustrating a host system and a memory storage apparatus according to an exemplary embodiment of the present invention.

Figure 1B:
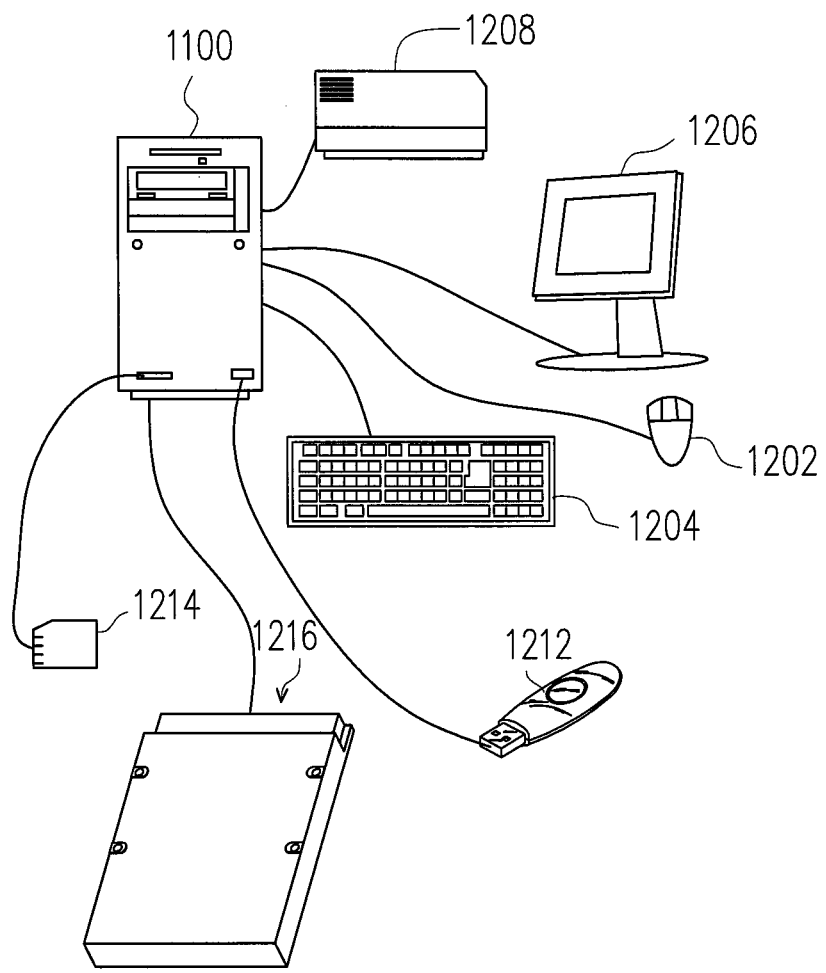
FIG. 1B is a schematic diagram illustrating a computer, an input/output (I/O) device, and a memory storage apparatus according to an exemplary embodiment of the present invention.

With reference to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 may include a mouse 1202, a keyboard 1204, a display 1206, and a printer 1208 as depicted in FIG. 1B. It should be noted that the devices in FIG. 1B are not limited to the I/O device 1106. The I/O device 1106 may include other devices.

In the present exemplary embodiment, the memory storage apparatus 100 is coupled to the other devices/components of the host system 1000 through the data transmission interface 1110. Based on the operations of the microprocessor 1102, the RAM 1104 and the I/O device 1106, the host system 1000 may write data into the memory storage apparatus 100, or the host system 1000 may read data from the memory storage apparatus 100. For instance, the memory storage apparatus 100 may be, for example, a rewritable non-volatile memory storage apparatus, such as, a flash drive 1212, a memory card 1214, or a solid state drive (SSD) 1216 as shown in FIG. 1B.

Figure 1C:
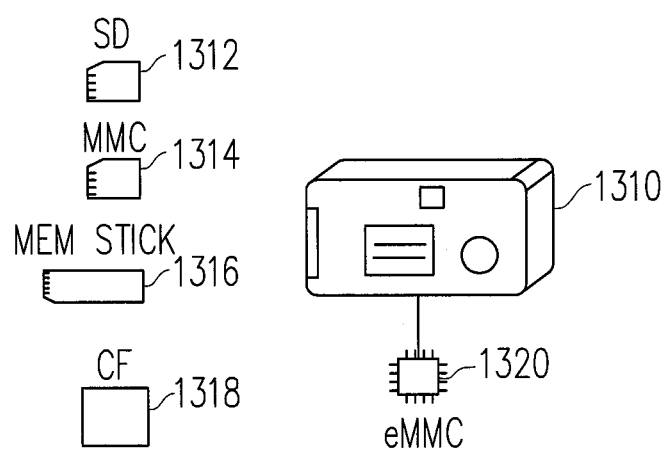
FIG. 1C is a schematic diagram illustrating a host system and a memory storage apparatus according to another exemplary embodiment of the present invention.

Generally speaking, the host system 1000 may be any system that can be substantially operated together with the memory storage apparatus 100 to store data. The present exemplary embodiment takes the host system 1000 as a computer system, for example. However, in another exemplary embodiment of the invention, the host system 1000 may also be a digital camera, a video camera, a communication device, an audio player, or a video player. For instance, when the host system is a digital camera 1310 illustrated in FIG. 1C, the rewritable non-volatile memory storage apparatus may be a secure digital (SD) card 1312, a multimedia card (MMC) 1314, a memory stick (MS) 1316, a compact flash (CF) card 1318, or an embedded storage device 1320 used by the digital camera 1310 (as shown in FIG. 1C). The embedded storage device 1320 includes an embedded multimedia card (eMMC). It should be noted that the eMMC is electrically coupled to a motherboard of the host system directly.

Figure 2:
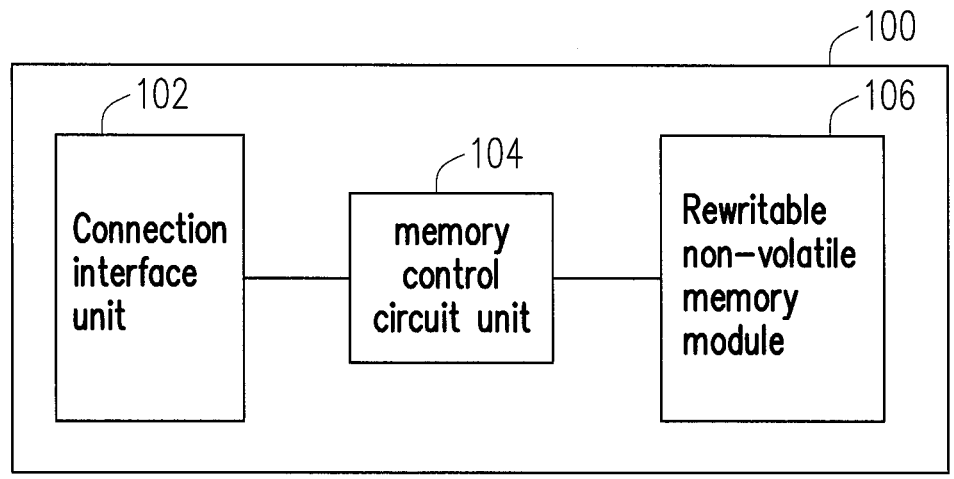
FIG. 2 is a schematic block diagram of the memory storage apparatus depicted in FIG. 1A.

FIG. 2 is a schematic block diagram of the memory storage apparatus depicted in FIG. 1A.

With reference to FIG. 2, the memory storage apparatus 100 includes a connection interface unit 102, a memory control circuit unit 104 and a rewritable non-volatile memory module 106.

In the present exemplary embodiment, the connection interface unit 102 complies with the secure digital (SD) standard. However, it is to be understood that the invention is not limited thereto, and the connection interface unit 102 may also comply with the parallel advanced technology attachment (PATA) standard, the Institute of Electrical and Electronic Engineers (IEEE) 1394 standard, the peripheral component interconnect (PCI) express standard, the universal serial bus (USB) standard, the ultra high speed-I (UHS-I) standard, the ultra high speed-II (UHS-II) standard, the serial advanced technology attachment (SATA) standard, the memory stick (MS) standard, the multi media card (MMC) standard, the compact flash (CF) standard, the integrated device electronics (IDE) standard, or other suitable standards. In the present exemplary embodiment, the connection interface unit and the memory controlling circuit unit 104 may be packaged into one chip, or the connection interface unit 102 is distributed outside of a chip containing the memory controlling circuit unit 104.

The memory controlling circuit unit 104 is configured to execute a plurality of logic gates or control commands which are implemented in a hardware from or in a firmware from and perform operations of writing, reading or erasing data in the rewritable non-volatile memory storage module 106 according to the commands of the host system 1000.

The rewritable non-volatile memory storage module 106 is coupled to the memory controlling circuit unit 104 and configured to store data written from the host system 1000. The rewritable non-volatile memory storage module 106 has physical erasing units 510(0) to 510(N). For instance, the physical erasing units 510(0) to 510(N) may belong to the same memory die or belong to different memory dies. Each physical erasing unit has a plurality of physical programming units. For example, in the present exemplary embodiment, each physical erasing unit contains 258 physical programming units, and physical programming units belonging to the same physical erasing unit may be written independently and erased simultaneously. However, it is to be understood that the present invention is not limited thereto, and each physical erasing unit may contain 64 physical programming units, 256 physical programming units or any number of physical programming units.

To be more detailed, a physical erasing unit is the smallest is the smallest unit for erasing data, namely, each physical erasing unit contains the least number of memory cells that are erased all together. A physical programming unit is the smallest unit for programming data, namely, each physical programming unit is the smallest unit for writing data. Each physical programming unit commonly includes a data bit area and a redundant bit area, and the data bit area includes a plurality of physical access addresses for storing data of users, and the redundant bit area is configured for storing system data (e.g., control information and error correcting codes). In the present exemplary embodiment, each data bit area of the physical programming units contains 4 physical access addresses, and the size of each physical access address is 512 bytes. However, in other exemplary embodiments, more or less number of the physical access addresses may be contained in the data bit area, and the amount and the size of the physical access addresses are not limited in the present invention.

In the present exemplary embodiment, the rewritable non-volatile memory module 106 is a trinary-level cell (TLC) NAND flash memory module (i.e., a flash memory module capable of storing data of 3 bits in one memory cell). However, the present invention is not limited thereto, and the rewritable non-volatile memory module 106 may also be a multi-level cell (MLC) NAND flash memory module (i.e., a flash memory module capable of storing data of 2 bits in one memory cell), other flash memory modules, or other memory modules having the same characteristics.

Figure 3A:
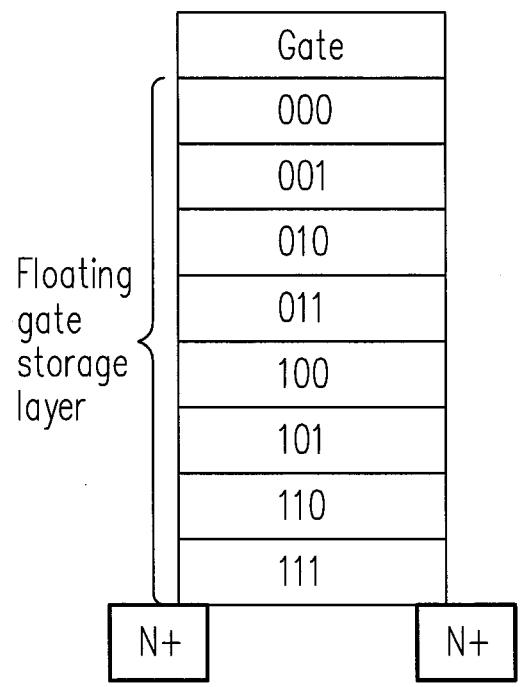
FIG. 3A and FIG. 3B are schematic diagrams illustrating examples of a storage structure of a memory cell and physical erasing units according to an exemplary embodiment of the present invention.
Figures 3B, 4:
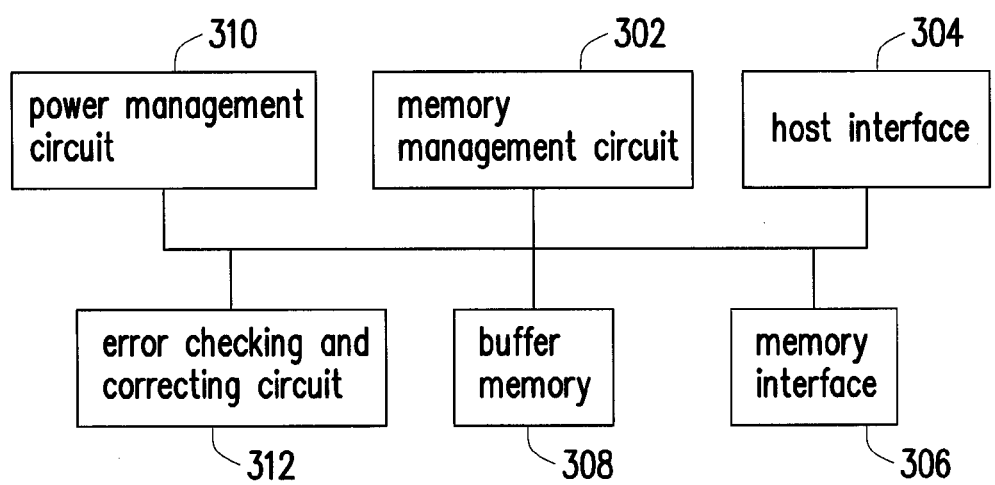
FIG. 4 is a schematic block diagram illustrating a memory control circuit unit according to an exemplary embodiment of the present invention.

FIG. 3A and FIG. 3B are schematic diagrams illustrating examples of a storage structure of a memory and physical erasing units according to an exemplary embodiment of the present invention.

With reference to FIG. 3A, a storage state of each memory cell of the rewritable non-volatile memory module 106 can be recognized as "111", "110", "101", "100", "011", "010", "001" or "000" (shown in FIG. 3A), in which a first bit counted from the left is a least significant bit (LSB), a second bit counted from the left is a center significant bit (CSB) and a third bit counted from the left is a most significant bit (MSB). Moreover, a plurality of memory cells arranged on a same word line may from 3 physical programming units, where the physical programming unit formed by the LSBs of the memory cells is referred to as a lower physical programming unit, the physical programming unit formed by the CSBs of the memory cells is referred to as a middle physical programming unit, and the physical programming unit formed by the MSBs of the memory cells is referred to as an upper physical programming unit.

With reference to FIG. 3B, a physical erasing unit is composed of a plurality of physical programming unit groups, where each of the physical programming unit groups includes a lower physical programming unit, a middle physical programming unit and an upper physical programming unit formed by a plurality of memory cells arranged on a same word line. For instance, in the physical erasing unit, a $0^{th}$ physical programming unit belonging to the lower physical programming unit, a $1^{st}$ physical programming unit belonging to the middle physical programming units and a $2^{nd}$ physical programming unit belonging to the upper physical programming unit are regarded as one physical programming unit group. Similarly, the $3^{rd}$, $4^{th}$ and $5^{th}$ physical programming units are regarded as one physical programming unit group, and deduced by analogy, the other physical programming units are also grouped into a physical programming unit group according to such manner.

FIG. 4 is a schematic block diagram illustrating a memory control circuit unit according to an exemplary embodiment of the present invention. It should be understood that the memory control circuit unit illustrated in FIG. 4 is merely an example, but the present invention is not limited thereto.

With reference to FIG. 4, the memory control circuit unit 104 includes a memory management circuit 302, a host interface 304, a memory interface 306, buffer memory 308, power management circuit 310, and an ECC circuit 312.

The memory management circuit 302 is configured to control the whole operation of the memory control circuit unit 104. Particularly, the memory management circuit 302 has a plurality of control instructions, and when the memory storage apparatus 100 is operated, the control instructions are executed to perform operations, such as data writing, data reading, a data erasing, data merging and so on.

In the present embodiment, the control instructions of the memory management circuit 302 are implemented in a firmware form. For instance, the memory management circuit 302 has a microprocessor unit (not shown) and a read-only memory (ROM, not shown), and the control instructions are burning recorded in the ROM. When the memory storage apparatus 100 is operated, the control instructions are executed by the microprocessor unit to perform the operations, such as data writing, data reading, data erasing, data merging and so on.

In another exemplary embodiment of the invention, the control instructions of the memory management circuit 302 are stored as program codes in a specific area (e.g. a system area in a memory module exclusively used for storing system data) of the rewritable non-volatile memory module 106. Additionally, the memory management circuit 302 has a microprocessor unit (not shown), a read-only memory (ROM, not shown) and a random access memory (RAM, not shown). In particular, the ROM has a boot code, and when the memory control circuit unit 104 is enabled, the microprocessor unit first executes the boot code to load the control instructions from the rewritable non-volatile memory module 106 into the RAM of the memory management circuit 302. The microprocessor unit then executes the control instructions to perform the operation, such as data writing, data reading, data merging and data erasing.

Furthermore, in another exemplary embodiment of the invention, memory management circuit 302 the control instructions of the memory management circuit 302 may be implemented in a hardware form. For instance, the memory management circuit 302 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro controller. The memory cell management circuit is configured to manage the physical erasing units of the rewritable non-volatile memory module 106, the memory writing circuit is configured to give the write command to the rewritable non-volatile memory module 106 to write data into the rewritable non-volatile memory module 106, the memory reading circuit is configured to give the read command to the rewritable non-volatile memory module 106 to read data from the rewritable non-volatile memory module 106, the memory erasing circuit is configured to give the erase command to the rewritable non-volatile memory module 106 to erase data in the rewritable non-volatile memory module 106, and the data processing circuit is configured to process data to be written into the rewritable non-volatile memory module 106 and data read from the rewritable non-volatile memory module 106.

The host interface 304 is coupled to the memory management circuit 302 and configured to receive and identify commands and data transmitted by the host system 1000. Namely, the commands and the data from the host system 1000 is transmitted to memory management circuit 302 through the host interface 304. In the present exemplary embodiment, host interface 304 the host interface 304 complies with the SD standard, but the invention is not limited thereto. The host interface 304 may also comply with the PATA standard, the IEEE 1394 standard, the PCI express standard, the USB standard, the UHS-I interface standard, the UHS-II interface standard, the SATA standard, the MS standard, the MMC standard, the CF standard, the IDE standard, or other suitable standards.

The memory interface 306 is coupled to the memory management circuit 302 and configured to access the rewritable non-volatile memory module 106. Namely, the data to be written into the rewritable non-volatile memory module 106 is converted to an acceptable format for the rewritable non-volatile memory module 106 by the memory interface 306.

In an exemplary embodiment, the memory control circuit unit 104 further includes a buffer memory 308, a power management circuit 310 and an error checking and correcting circuit (ECC) circuit 312.

The buffer memory 308 is coupled to the memory management circuit 302 and configured to temporarily store data and commands from the host system 1000 or data from the rewritable non-volatile memory module 106.

The power management circuit 310 is coupled to the memory management circuit 302 and configured to control a power of the memory storage device 100.

The ECC circuit 312 is coupled to the memory management circuit 302 and configured to perform an error checking and correcting process to ensure the correctness of data. Specifically, when the memory management circuit 302 receives a write command from the host system 1000, the ECC circuit 312 generates an error and correcting (ECC) code for data corresponding to the write command, and the memory management circuit 302 writes data and the ECC code corresponding to the write command to the rewritable non-volatile memory module 106. Subsequently, when the memory management circuit 302 reads the data from the rewritable non-volatile memory module 106, the ECC code corresponding to the data is also read, and the ECC circuit 312 may execute the error checking and correcting procedure for the read data according to the ECC code.

In the present exemplary embodiment, the rewritable non-volatile memory module is at least partitioned into a temporary area and a free area. For instance, in the present exemplary embodiment, settings of the number of the physical erasing units partitioned into the temporary area and the number of the physical erasing units partitioned into the free area are already done when the rewritable non-volatile memory module is manufactured, while in other embodiments, the number of the physical erasing units contained in each area may also be set by firmware or software.

Figure 5:
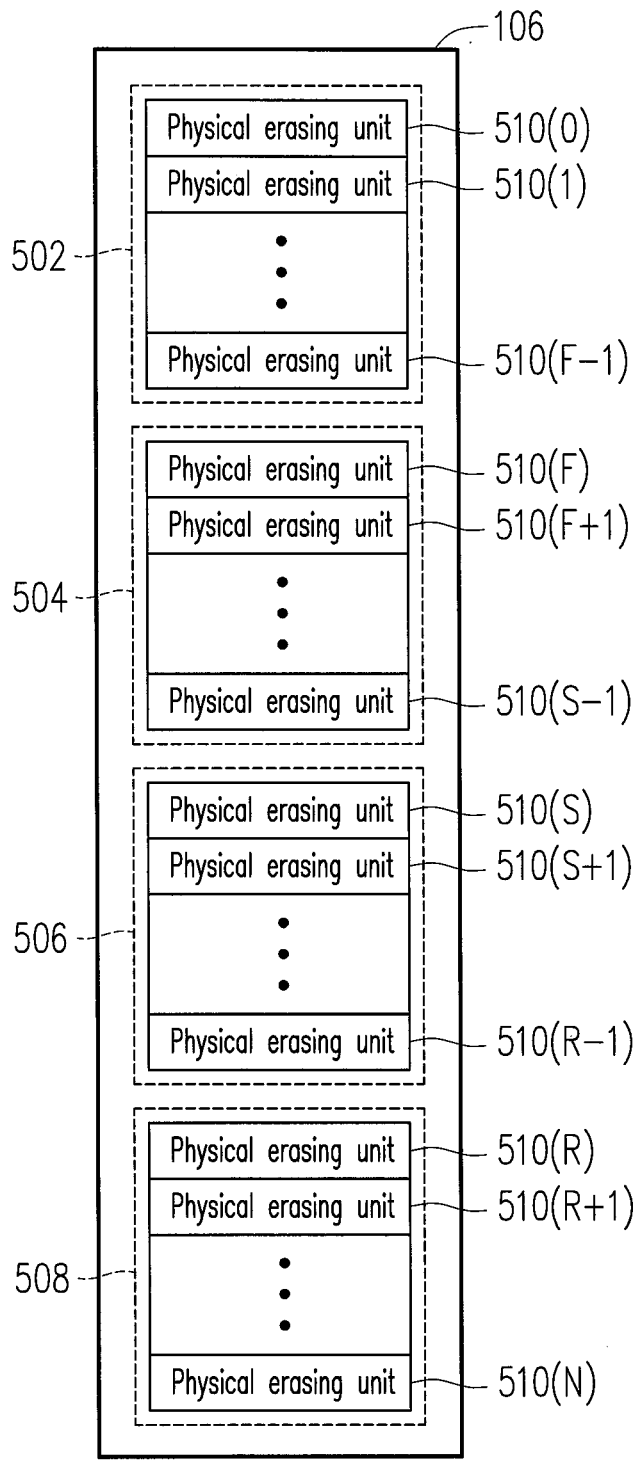
FIG. 5 and FIG. 6 are schematic diagrams illustrating examples of managing the physical erasing units according to an exemplary embodiment of the present invention.
Figure 6:
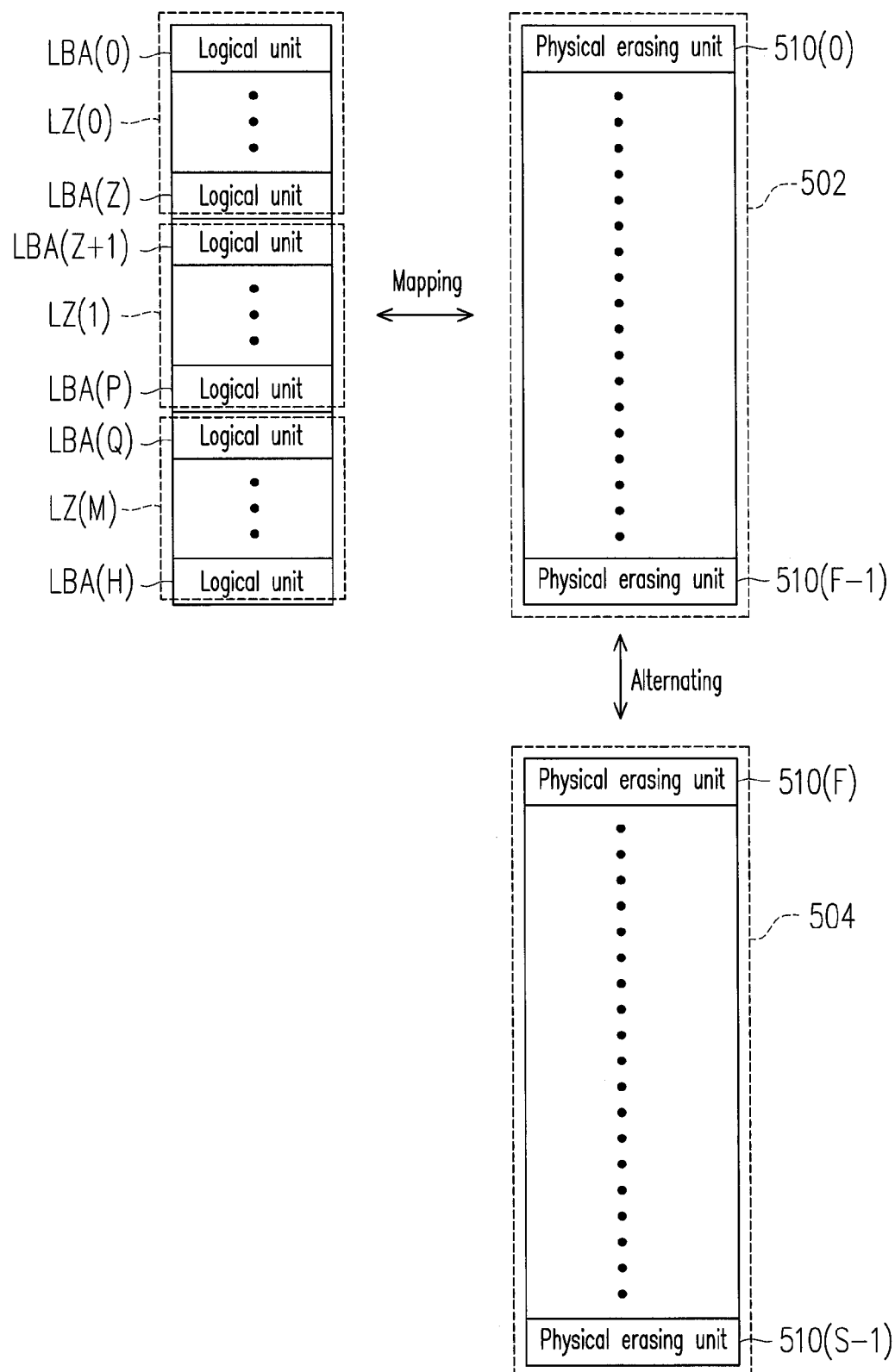

FIG. 5 and FIG. 6 are schematic diagrams illustrating examples of managing the physical erasing units according to an exemplary embodiment of the present invention.

With reference to FIG. 5, the rewritable non-volatile memory module 106 has physical erasing units 510(0) to 510(N), and the memory control circuit unit 104 (or the memory management circuit 302) logically partitions the physical erasing units 510(0) to 510(N) into a data area 502, a free area 504, a temporary area 506 and a replacement area 508.

The physical erasing units logically belonging to the data area 502 and the free area 504 are used for storing data from the host system 1000. To be more specific, the physical erasing units belonging to the data area 502 are regarded as physical erasing units with data stored therein, and the physical erasing units belonging to the free area 504 are physical erasing units in replacement with the data area 502. Namely, when the host system 1000 receives a write command and data to be written, the memory control circuit unit 104 (or the memory management circuit 302) selects a physical erasing unit from the free area 504 and writes the data into the selected physical erasing unit so as to replace the physical erasing unit of the data area 502.

The physical erasing units logically belonging to the temporary area 506 are used for recording system data. For instance, the system data includes a logical address-physical address mapping table, the manufacturers and models of the rewritable non-volatile memory module, the number of physical blocks in the rewritable non-volatile memory modules, the number of physical programming units of each physical erasing unit. Specially, in the present exemplary embodiment, the temporary area 506 is configured not only to store system data, but also as temporary physical erasing units of the temporary physical erasing unit group corresponding to the logical unit to temporarily store the data written by the host system 1000. Methods and steps of temporarily storing data will be described with reference to the drawings below.

The physical erasing units logically belonging to the replacement area 508 are used for replacing damaged physical erasing units. To be more specific, if there are still normal physical erasing units is the replacement area 508, and a physical erasing unit in the data area 502 is damaged, the memory management circuit 302 elects a normal physical erasing unit from the replacement area 508 to replace the damaged physical erasing unit.

Specially, the number of the physical erasing units belonging to the data area 502, the free area 504, the temporary area 506 and the replacement area 508 vary with different memory types. Additionally, it is to be understood that in the operation of the memory storage apparatus 100, the physical erasing units associated with the data area 502, the free area 504, the temporary area 506 and the replacement area 508 are dynamically changed. For instance, when one physical erasing unit in the free area 504 is damaged and replaced by a physical erasing unit of the replacement area 508, the physical erasing units originally associated with the replacement area 508 is associated with the free area 504.

With reference to FIG. 6, the memory control circuit unit 104 (or the memory management circuit 302) configures logical units LBA(0) to LBA(H) for mapping the physical erasing units belonging to the data area 502, where each logical unit has a plurality of logical sub-units to be mapped to the physical programming units of the corresponding physical erasing unit. In the meantime, when the host system 100 is to write data into a logical unit or update the data stored in the logical unit, the memory control circuit unit 104 (or memory management circuit 302) selects a physical erasing unit from the free area 504 for writing data to alternatively replace the physical erasing unit of the data area 502. In the present exemplary embodiment, a logical sub-unit may be a logical page or a logical sector.

In order to identify where each logical unit of data is stored in the physical erasing unit, in the present exemplary embodiment, the memory control circuit unit 104 (or the memory management circuit 302) records mapping relations between the logical units and the physical erasing units. When the host system 1000 is about to access data in the logical sub-unit, the memory control circuit unit 104 (or memory management circuit 302) confirms the logical unit where the logical sub-units belong to and accesses data from the physical erasing unit mapped to the logical unit. For instance, in the present exemplary embodiment, the memory control circuit unit 104 (or memory management circuit 302) stores a logical address-physical address mapping table in the rewritable non-volatile memory module 106 for recording each physical erasing unit mapped to the logical unit. When accessing data, the memory control circuit unit 104 (or memory management circuit 302) loads the logical address-physical address mapping table of the buffer memory 308 for updating.

It should be mentioned that the buffer memory 308 may be incapable of recording mapping tables recording the mapping relations of all logical units due to its limited capacity. Therefore, in the present exemplary embodiment, the memory control circuit unit 104 (or the memory management circuit 302) groups the logical units LBA(0) to LBA(H) into a plurality of logical zones LZ(0) to LZ(M) and assigns one logical address mapping table to each logical zone. Specially, when the memory control circuit unit 104 (or the memory management circuit 202) memory control circuit unit 104 (or the memory management circuit 202). The logical address-physical address mapping table corresponding to the logical zone of the logical unit is loaded to the buffer memory buffer memory 308 and is then updated.

In the present embodiment, when receiving a write command instructing to store data (which is referred to as first data below) in the a logical unit (which is referred to as a first logical unit below) from the host system 1000, the memory control circuit unit 104 (or the memory management circuit 302) selects several physical erasing units from the free area 504 or the temporary area 506 as temporary physical erasing units of a temporary physical erasing unit group (which is referred to as a first temporary physical erasing unit group) corresponding to the first logical unit and temporarily stores the first data in lower physical programming units of the temporary physical erasing unit by using a single-page mode. The memory control circuit unit 104 (or the memory management circuit 302) then writes the data in the temporary physical erasing unit group into corresponding physical erasing units by using a multi-page mode and maps the first logical unit to the corresponding physical erasing units.

Here, the single-page mode refers to storing data only by using the lower physical programming units. Namely, in the single-page mode, the memory control circuit unit 104 (or the memory management circuit 302) merely performs the data writing operation into the lower physical programming units. Since the temporary physical erasing units are operated in the single-page mode, in the present exemplary embodiment, only ⅓ of a temporary physical erasing unit is used, and a temporary physical erasing unit group corresponding to one logical unit contains 3 temporary physical erasing units to provide a sufficient space for storing data of a logical unit. In the present exemplary embodiment, the memory control circuit unit 104 (or the memory management circuit 302) uses the single-page mode to operate the physical erasing units in the temporary area 506 or uses the single-page mode to operate the temporary physical erasing units in the temporary physical erasing unit group.

The multi-page mode refers to storing data by using the lower physical programming unit, the middle physical programming unit and the upper physical programming unit. Namely, when writing data by using the multi-page mode, the memory control circuit unit 104 (or the memory management circuit 302) performs programming on the lower physical programming unit, the middle physical programming unit and the upper physical programming unit belonging to one same physical programming unit group. It is to be mentioned that in an exemplary embodiment, when using the multi-page mode to operate the physical erasing units, the physical programming units belonging to the same physical programming unit group are programmed simultaneously or in phases. Moreover, when being compared with using the single-page mode to operate the physical erasing units, the physical erasing units operated by using the multi-page mode have shorter lifespan. To be more specific, each physical erasing unit may be written or erased in a limited number. When the number of writing one physical erasing unit exceeds a threshold, the physical erasing unit may be damaged, and no data can be written. The threshold corresponding to the operation of the physical erasing unit by using the multi-page mode is lower than the operation of the physical erasing unit by using the single-page mode. In the present exemplary embodiment, the memory control circuit unit 104 (or the memory management circuit 302) operates the physical erasing units associated with the data area 502 by using the multi-page mode.

In the present exemplary embodiment, after a physical erasing unit is partitioned into the temporary area 506, the physical erasing unit can only be used in the temporary area 506 without being collectively used with the physical erasing units belonging to the free area 504 and the data area 502. Namely, the memory control circuit unit 104 (or the memory management circuit 302) operates the physical erasing units belonging to the temporary area 506 independently from the free area 504. For instance, after a physical erasing unit is partitioned into the temporary area 506, the memory control circuit unit 104 (or the memory management circuit 302) operates the physical erasing unit in the temporary area 506 using the single-page mode until the physical erasing unit is damaged.

Figure 7:
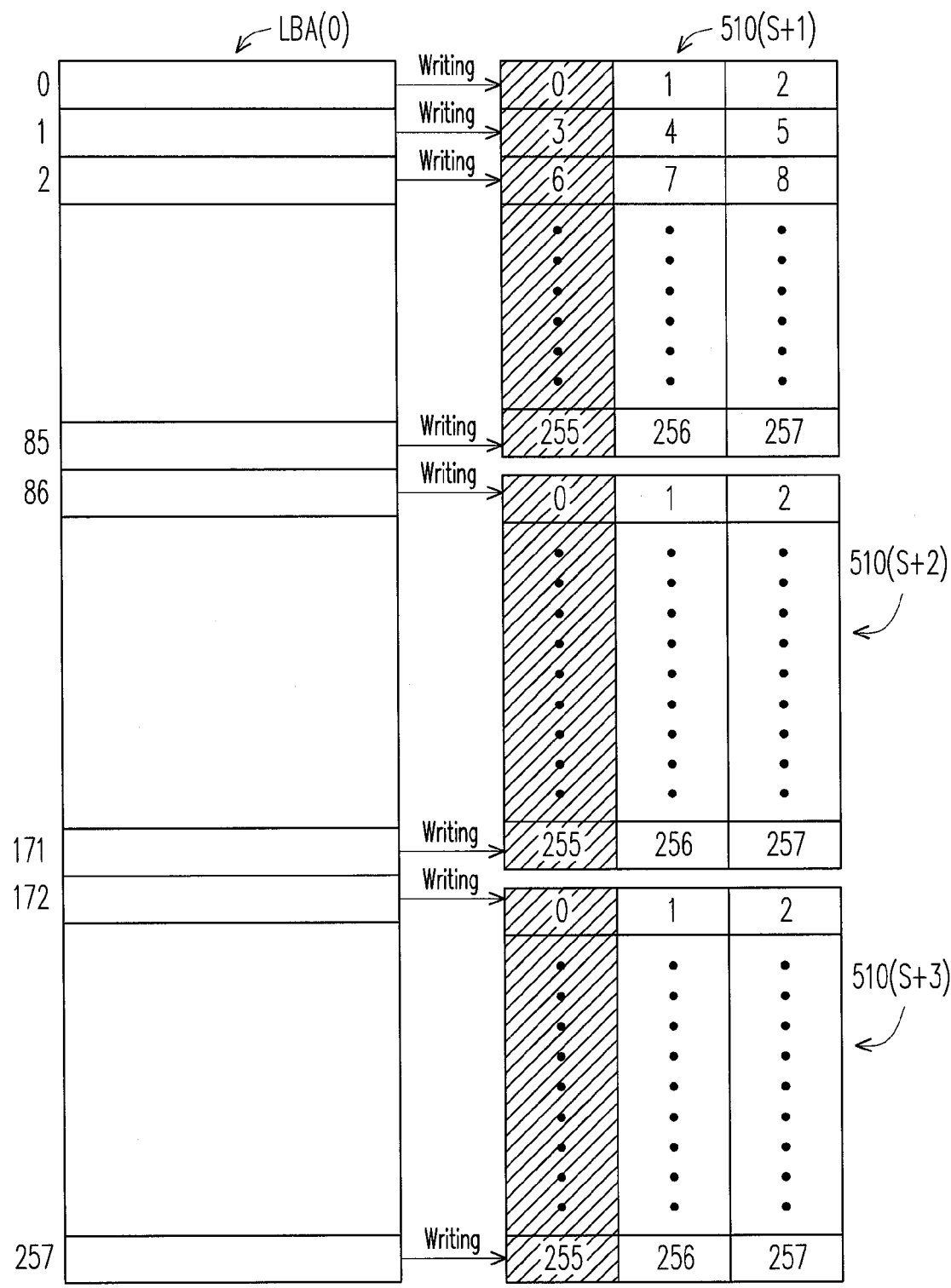
FIG. 7 is a schematic diagram illustrating an example of temporarily storing data according to an exemplary embodiment of the present invention.

FIG. 7 is a schematic diagram illustrating an example of temporarily storing data according to an exemplary embodiment of the present invention.

With reference to FIG. 7, when receiving a write command from the host system 1000 that instructs to store updated data in the $0^{th}$ to the $257^{th}$ logical sub-units of the logical unit LBA(0), assumed that the memory control circuit unit 104 (or the memory management circuit 302) only selects 3 physical erasing units 510(S+1), 510(S+2) and 510(S+3) from the temporary area 506 respectively as a first temporary physical erasing unit, a second temporary physical erasing unit and a third temporary physical erasing unit of the temporary physical erasing unit group corresponding to the logical unit LBA (0), the memory control circuit unit 104 (or the memory management circuit 302) writes the updated data belonging to the logical unit LBA(0) by using the first temporary physical erasing unit 510(S+1), the second temporary physical erasing unit 510(S+2) and the third temporary physical erasing unit 510(S+3) of the temporary physical erasing unit group corresponding to the logical unit LBA(0).

For instance, the memory control circuit unit 104 (or the memory management circuit 302) sequentially writes the updated data (as referred to as first part of data) to be stored in the $0^{th}$ to $85^{th}$ logical sub-units of the logical unit LBA(0) into the lower physical programming units of the first temporary physical erasing unit 510(S+1), sequentially writes the updated data (also referred to as second part of data) to be stored in the $86^{th}$ to $171^{st}$ logical sub-units of the logical unit LBA(0) into the lower physical programming units of the second temporary physical erasing unit 510(S+2) and sequentially writes the updated data (also referred to as third part of data) to be stored in the $172^{nd}$ to $257^{th}$ logical sub-units of the logical unit LBA(0) into the lower physical programming units of the third temporary physical erasing unit 510 (S+3). It is to be mentioned that when a great amount of data is continuously written, the aforementioned operation of writing data according to page sequences of the first temporary physical erasing unit, the second temporary physical erasing unit and the third temporary physical erasing unit may be performed by a cache programming command to effectively improve a speed of writing data. In another embodiment, the memory control circuit unit 104 (or the memory management circuit 302) re-organizes or re-arranges the updated data to be stored in each of the logical sub-units of the logical unit LBA(0) and then, writes the updated data into the lower physical programming units of the first temporary physical erasing unit 510(S+1), the lower physical programming units of the second temporary physical erasing unit 510(S+2) and the lower physical programming units of the third temporary physical erasing unit 510(S+3) simultaneously.

In the present exemplary embodiment, after writing the updated data to be stored by the host system 1000 into the first temporary physical erasing unit 510(S+1), the second temporary physical erasing unit 510(S+2) and the third temporary physical erasing unit 510(S+3) of the temporary physical erasing unit group corresponding to the logical unit LBA(0), the memory control circuit unit 104 (or the memory management circuit 302) transmits a response indicating that the command is completed to the host system 1000. Thereafter, when the memory storage apparatus 100 is in an idle state for a time period (e.g., no command is received from the host system 1000 for 30 seconds) or the number of free physical erasing units of the temporary area 506 and the free area 504 is less than a predetermined threshold, the memory control circuit unit 104 (or the memory management circuit 302) merges valid data belonging to the logical unit from the temporary physical erasing unit group corresponding to logical unit to an empty physical erasing unit and maps the logical unit to the physical erasing unit. For instance, the predetermined threshold may be set to be 3. However, it should be understood that the present invention is not limited thereto, and the predetermined threshold may be set to be any other suitable value. Herein, the operation of copying the valid data belonging to the logical unit from the temporary physical erasing unit group corresponding to one logical unit to another physical erasing unit in the data area 502 corresponding to the logical unit may be referred to as a data merge operation.

Figure 8:
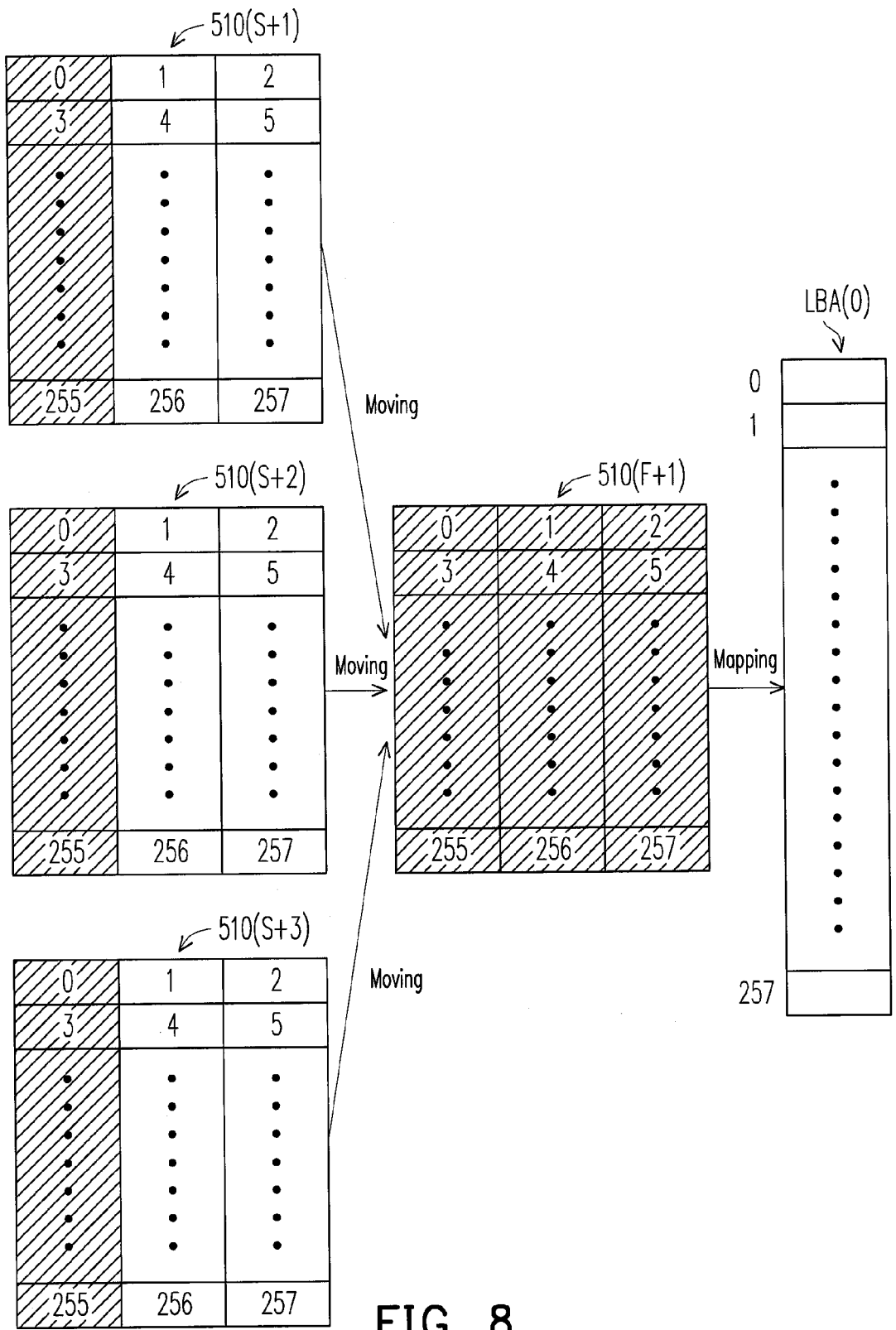
FIG. 8 is a schematic diagram illustrating an example of a data merge procedure according to an exemplary embodiment of the present invention.

FIG. 8 is a schematic diagram illustrating an example of a data merge procedure according to an exemplary embodiment of the present invention.

It is assumed that the valid data belonging to all the logical sub-units of the logical unit LBA(0) of the first temporary physical erasing unit 510(S+1), the second temporary physical erasing unit 510(S+2) and the third temporary physical erasing unit 510(S+3) of the temporary physical erasing unit group corresponding to the logical unit LBA(0) is stored (as shown in FIG. 7), and the memory management circuit 302 selects the logical unit LBA(0) for the data merge operation.

First, referring to FIG. 8, the memory control circuit unit 104 (or the memory management circuit 302) selects a physical erasing unit from the free area 504 as a physical erasing unit 510(F+1) for alternating (which is referred to as a first physical erasing unit 510 (F+1)). To be more specific, the memory control circuit unit 104 (or the memory management circuit 302) selects an empty physical erasing unit or a physical erasing unit storing invalid data from the free area 504. Particularly, if the selected physical erasing unit stores invalid data, the memory control circuit unit 104 (or the memory management circuit 302) first performs an erasing operation on the physical erasing unit. In other words, the invalid data in the physical erasing unit has to be erased first.

Then, with reference to FIG. 8, the memory control circuit unit 104 (or the memory management circuit 302) copies the valid data belonging to the $0^{th}$ to $85^{th}$ logical sub-units of the logical unit LBA(0) from the lower physical programming units of the first temporary physical erasing unit 510(S+1) to corresponding pages (e.g., the $0^{th}$ to $85^{th}$ physical programming units) of the first physical erasing unit 510(F+1). Then, the memory control circuit unit 104 (or the memory management circuit 302) copies the valid data belonging to the $86^{th}$ to $171^{st}$ logical sub-units of the logical unit LBA(0) from the lower physical programming units of the second temporary physical erasing unit 510(S+2) to corresponding pages (e.g., the $86^{th}$ to $171^{st}$ physical programming unit) of the first physical erasing unit 510(F+1). Afterward, the memory control circuit unit 104 (or the memory management circuit 302) copies the valid data belonging to the $172^{nd}$ to $257^{th}$ logical sub-units of the logical unit LBA(0) from the lower physical programming units of the third temporary physical erasing unit 510(S+3) to corresponding pages (e.g., the $172^{nd}$ to $257^{th}$ physical programming units) of the first physical erasing unit 510(F+1).

It is to be mentioned that as described above, the physical erasing units to be associated with the data area 502 are operated by using the multi-page mode, and thus, the operation writing into the first physical erasing unit 510(F+1) uses a physical programming unit group as a unit for programming simultaneously or in phases. To be more specific, in an exemplary embodiment, the $0^{th}$, $1^{st}$ and $2^{nd}$ physical programming units of the first physical erasing unit 510(F+1) is simultaneously programmed, such that the data belonging to the $0^{th}$, $1^{st}$ and $2^{nd}$ logical sub-units of the logical unit LBA(0) are written thereto, the $3^{rd}$, $4^{th}$ and $5^{th}$ physical programming units of the first physical erasing unit 510(F+1) are simultaneously programmed, such that the data belonging to the $3^{rd}$, $4^{th}$ and $5^{th}$ of the logical unit LBA(0) are written thereto and so on. Likewise, data belonging to the other the logical sub-units is written into the first physical erasing unit 510(F+1) by using a physical programming unit group as a unit.

Finally, the memory control circuit unit 104 (or the memory management circuit 302) maps the logical unit LBA (0) to the first physical erasing unit 510(F+1) in the logical address-physical address mapping table and performs the erasing operation on the temporary physical erasing units 510(S+1) to 510(S+3) of the temporary physical erasing unit group corresponding to the logical unit. Namely, in the execution of the next write command, the erased temporary physical erasing units 510(S+1) to 510(S+3) may be selected again as the temporary physical erasing units corresponding to a logical unit where data is written to.

Accordingly, when receiving the write command, the memory control circuit unit 104 (or the memory management circuit 302) selects several physical erasing units from the free area 504 or the temporary area 506 as temporary physical erasing units of the temporary physical erasing unit group corresponding to the first logical unit for temporarily storing data. Particularly, in the present embodiment, the memory control circuit unit 104 (or the memory management circuit 302) calculates an average erasing count of the physical erasing units located in the temporary area 50 and compares the average erasing count with one or more default thresholds to decide whether to select the physical erasing units from the temporary area 506 or from the free area 504 as the temporary physical erasing units of the temporary physical erasing unit group corresponding to the one logical unit. A plurality of exemplary embodiments is provided to describe a data writing method of dynamically selecting a plurality of physical erasing units only from the physical erasing units of the temporary area, only from the physical erasing units of the free area or from the physical erasing units of the temporary are and free area as a plurality of temporary physical erasing units of a temporary physical erasing unit group corresponding to a logical unit and writing data into the temporary physical erasing unit group according to the average erasing count of the physical erasing units in the temporary area.

First Embodiment

Figure 9A:
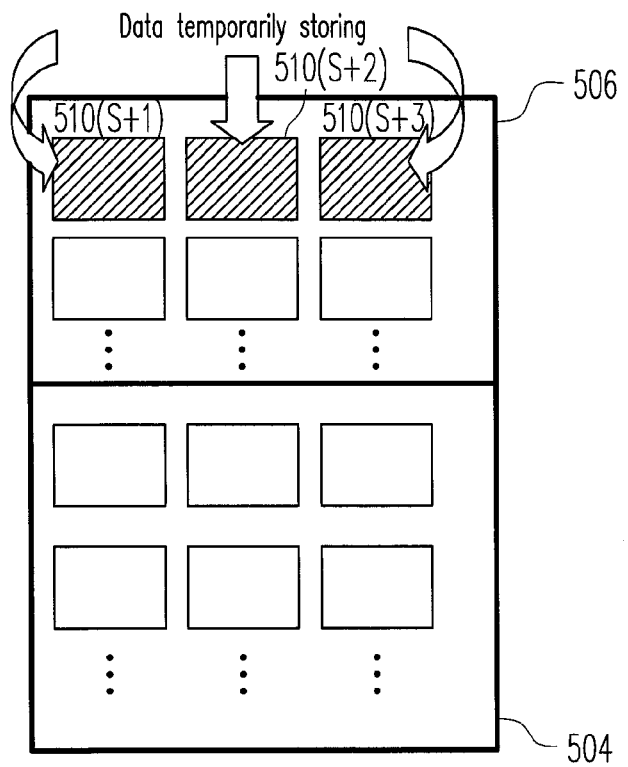
FIG. 9A is a schematic diagram illustrating an example of temporarily storing data according to the first exemplary embodiment of the present invention.

FIG. 9A is a schematic diagram illustrating an example of temporarily storing data according to the first exemplary embodiment of the present invention.

With reference to FIG. 9A, the memory control circuit unit 104 (or the memory management circuit 302) receives the first data to be stored in the first logical unit. For descriptive convenience, in this case, the size of the first data is equal to the capacity of one physical erasing unit. However, it is should be understood that in other exemplary embodiments, the size of the first data may also be equal to the capacity of multiple physical erasing units or smaller than the capacity of one physical erasing unit, and the invention is not limited thereto. In the first embodiment, three predetermined thresholds having values greater than 0 are set for the memory control circuit unit 104 (or the memory management circuit 302), and the relationship among the values is that the second predetermined threshold is greater than the third predetermined threshold, and the third predetermined threshold is greater than the first predetermined threshold. However, it is should be understood that the settings of and the comparison among the thresholds of the present exemplary embodiment are illustrated merely for describe the concept of the present invention instead of construing any limitations to the present invention.

After receiving the first data, the memory control circuit unit 104 (or the memory management circuit 302) first decides three temporary physical erasing units in the first temporary physical erasing unit group corresponding to the first logical unit. If the average erasing count of the physical erasing units of the temporary area 506 is less than or equal to the first predetermined threshold, the memory control circuit unit 104 (or the memory management circuit 302) selects three physical erasing units from the temporary area 506 as three temporary physical erasing units (e.g., the first temporary physical erasing unit 510(S+1), the second temporary physical erasing unit 510(S+2) and the third temporary physical erasing unit 510(S+3) illustrated in FIGS. 9A and 9B) (referring to hatched blocks therein) of the first temporary physical erasing unit group and writes the first data into the 3 temporary physical erasing units (i.e., the operation of "data temporarily stored" as shown in FIG. 9A). In particular, the memory control circuit unit 104 (or the memory management circuit 302) uses the single-page mode to operate the writing of the temporary physical erasing units, and thus, the first data is written into only the lower physical programming units of the three temporary physical erasing units.

Figure 9B:
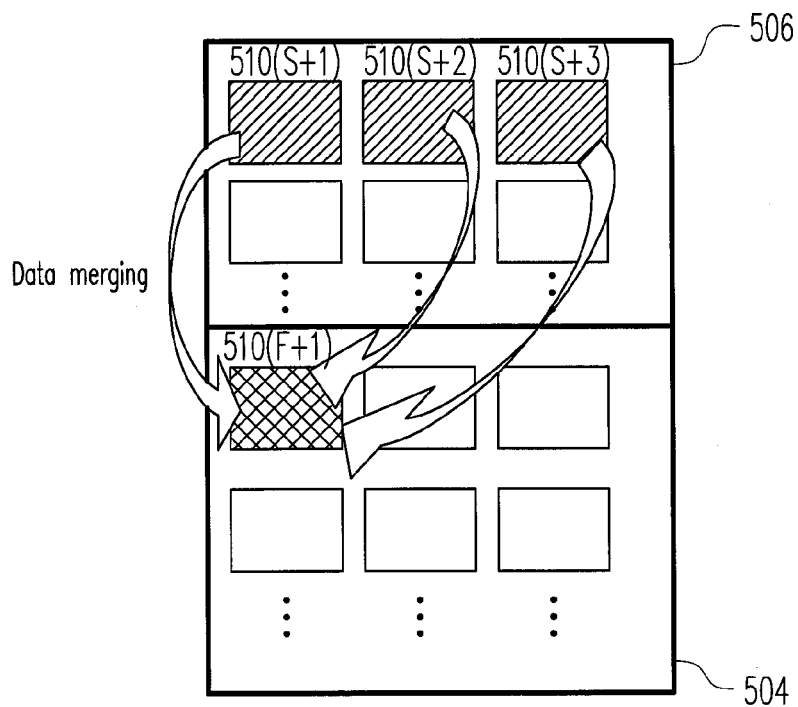
FIG. 9B is a schematic diagram illustrating an example of merging data according to the first exemplary embodiment of the present invention.

FIG. 9B is a schematic diagram illustrating an example of merging data according to the first exemplary embodiment of the present invention.

With reference to FIG. 9B, the memory control circuit unit 104 (or the memory management circuit 302) selects the first physical erasing unit 510(F+1) from the free area 504. Then, the memory control circuit unit 104 (or the memory management circuit 302) sequentially reads the first data from the lower physical programming units of the three temporary physical erasing units according to the sequence of writing the first data into the three temporary physical erasing units in the first temporary physical erasing unit group and simultaneously merges and writes the read first data into the upper, the middle and the lower physical programming units of first physical erasing unit 510(F+1) (i.e., the "data merging" operation illustrated in FIG. 9B). Then, the memory control circuit unit 104 (or the memory management circuit 302) maps the first logical unit to the first physical erasing unit 510(F+1) (i.e., by associating the first physical erasing unit 510(F+1) with the data area).

Figure 9C:
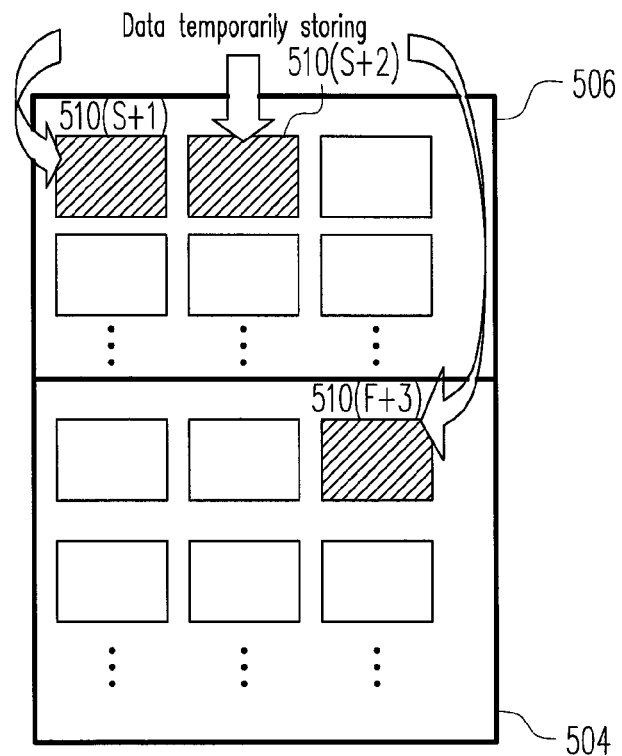
FIG. 9C is a schematic diagram illustrating another example of temporarily storing data according to the first exemplary embodiment of the present invention.

FIG. 9C is a schematic diagram illustrating another example of temporarily storing data according to the first exemplary embodiment of the present invention.

Figure 9D:
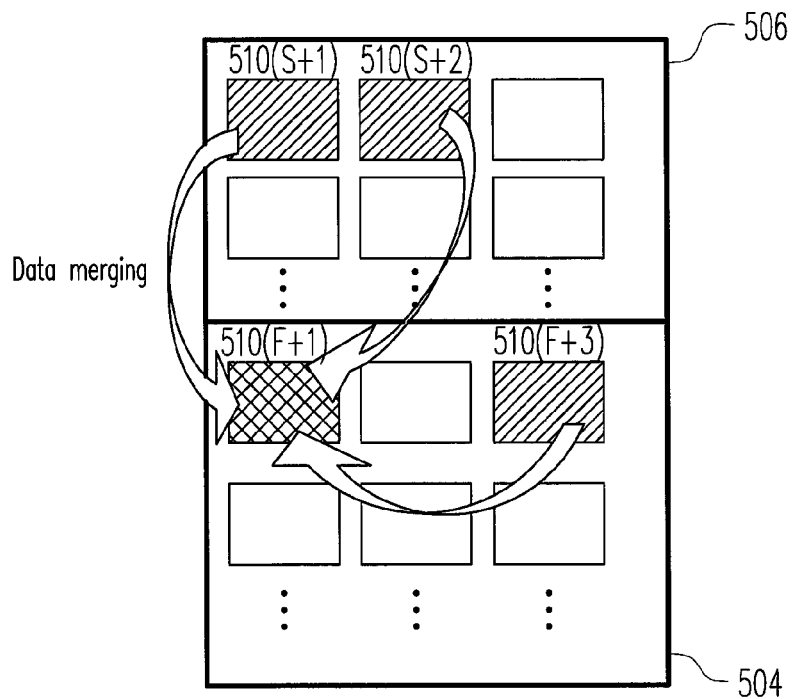
FIG. 9D is a schematic diagram illustrating another example of merging data according to the first exemplary embodiment of the present invention.

With reference to FIG. 9C, if the average erasing count of the physical erasing units of the temporary area 506 is less than or equal to the third predetermined threshold but greater than the first predetermined threshold, the memory control circuit unit 104 (or the memory management circuit 302) selects two physical erasing units from the temporary area 506 and one physical erasing unit from the free area 504 as the three temporary physical erasing units (e.g., the first temporary physical erasing unit 510(S+1), the second temporary physical erasing unit 510(S+2) and the third temporary physical erasing unit 510(F+3) illustrated in FIGS. 9C and 9D) of the first temporary physical erasing unit group and temporarily stores the first data in the three temporary physical erasing units.

FIG. 9D is a schematic diagram illustrating another example of merging data according to the first exemplary embodiment of the present invention.

With reference to FIG. 9D, the memory control circuit unit 104 (or the memory management circuit 302) selects the first physical erasing unit 510(F+1) from the free area 504. Then, the memory control circuit unit 104 (or the memory management circuit 302) sequentially reads the first data from the lower physical programming units of the three temporary physical erasing units according to the sequence of writing the first data into the three temporary physical erasing units in the first temporary physical erasing unit group and simultaneously merges and writes the read first data into the upper, the middle and the lower physical programming units of the first physical erasing unit 510(F+1). Thereafter, the memory control circuit unit 104 (or the memory management circuit 302) maps the first logical unit to the first physical erasing unit 510(F+1).

Figure 9E:
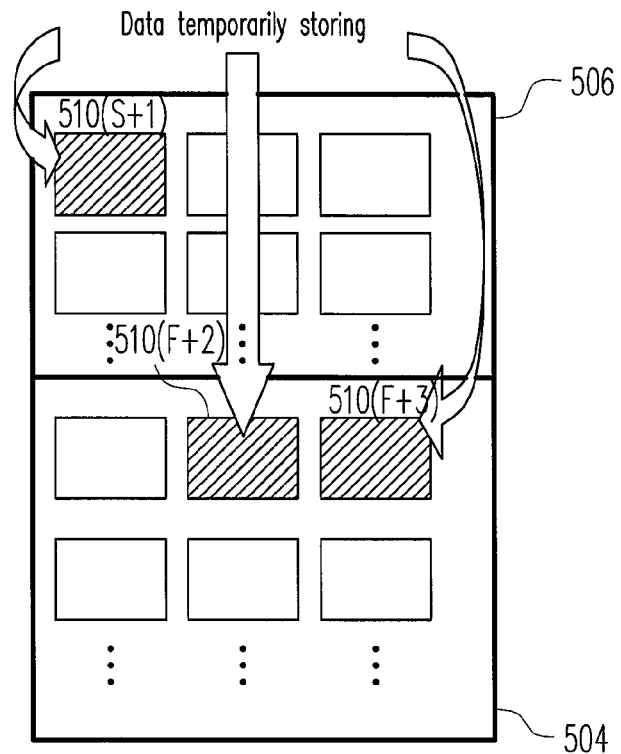
FIG. 9E is a schematic diagram illustrating yet another example of temporarily storing data according to the first exemplary embodiment of the present invention.

FIG. 9E is a schematic diagram illustrating yet another example of temporarily storing data according to the first exemplary embodiment of the present invention.

Figure 9F:
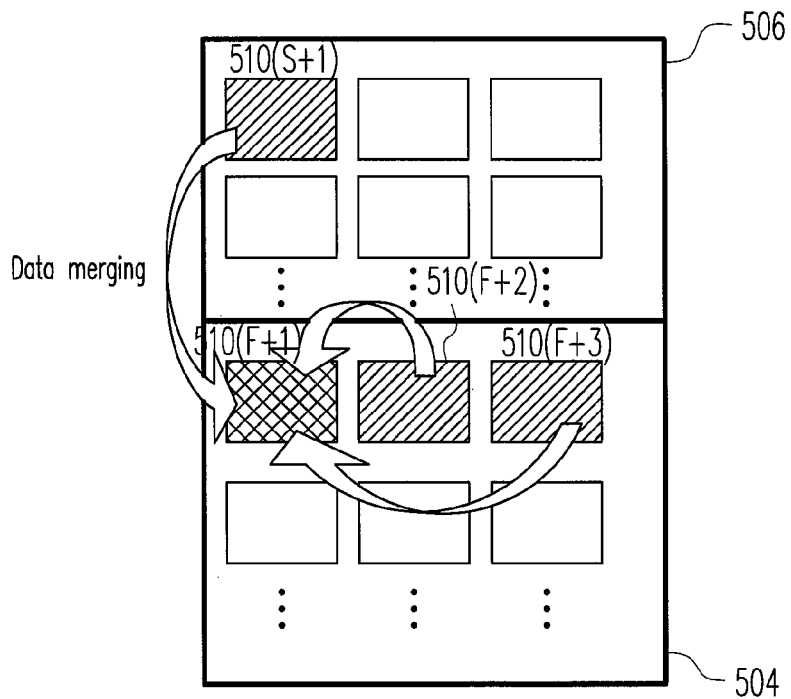
FIG. 9F is a schematic diagram illustrating yet another example of merging data according to the first exemplary embodiment of the present invention.

With reference to FIG. 9E, if the average erasing count of the physical erasing units of the temporary area 506 is less than or equal to the second predetermined threshold but greater than the third predetermined threshold, the memory control circuit unit 104 (or the memory management circuit 302) selects one physical erasing unit from the temporary area 506 and two physical erasing units from the free area 504 as the three temporary physical erasing units (e.g., the first temporary physical erasing unit 510(S+1), the second temporary physical erasing unit 510(F+2) and the third temporary physical erasing unit 510(F+3) illustrated in FIGS. 9E and 9F) of the first temporary physical erasing unit group and temporarily stores the first data in the three temporary physical erasing units.

FIG. 9F is a schematic diagram illustrating yet another example of merging data according to the first exemplary embodiment of the invention.

With reference to FIG. 9F, the memory control circuit unit 104 (or the memory management circuit 302) selects the first physical erasing unit 510(F+1) from the free area 504. Then, the memory control circuit unit 104 (or the memory management circuit 302) reads the first data from the lower physical programming units of the three temporary physical erasing unit according to the sequence of writing the first data into the three temporary physical erasing units of the first temporary physical erasing unit group and simultaneously merges and writes the read first data into the upper, the middle and the lower physical programming units of the first physical erasing unit 510(F+1). Thereafter, the memory control circuit unit 104 (or the memory management circuit 302) maps the first logical unit to the first physical erasing unit 510(F+1).

Figure 9G:
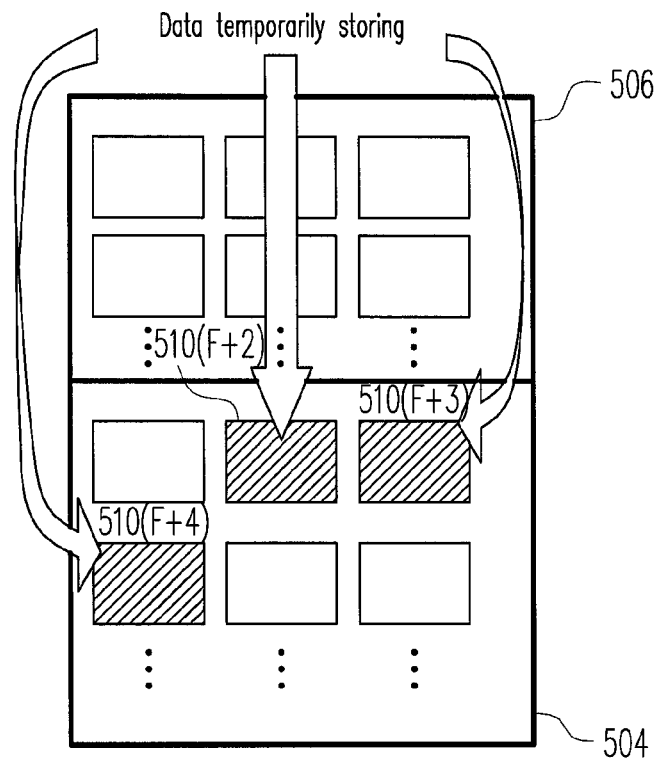
FIG. 9G is a schematic diagram illustrating still another example of temporarily storing data according to the first exemplary embodiment of the present invention.

FIG. 9G is a schematic diagram illustrating still another example of merging data according to the first exemplary embodiment of the present invention.

Figure 9H:
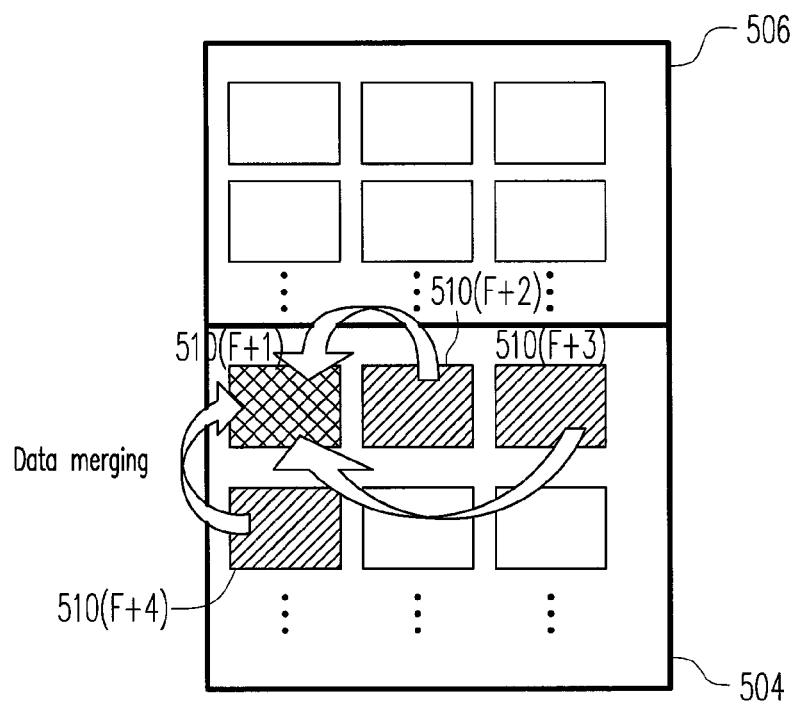
FIG. 9H is a schematic diagram illustrating still another example of merging data according to the first exemplary embodiment of the present invention.

With reference to FIG. 9G, if the average erasing count of the physical erasing units of the temporary area 506 is greater than the second predetermined threshold, the memory management circuit 302 selects three physical erasing units from the free area 504 as the three temporary physical erasing units (e.g., the first temporary physical erasing unit 510(F+4), the second temporary physical erasing unit 510(F+2) and the third temporary physical erasing unit 510(F+3) illustrated in FIG. 9G, 9H) of the first temporary physical erasing unit group and temporarily stores the first data in the three temporary physical erasing units.

FIG. 9H is a schematic diagram illustrating still another example of merging data according to the first exemplary embodiment of the present invention.

With reference to FIG. 9H, the memory control circuit unit 104 (or the memory management circuit 302) selects the first physical erasing unit 510(F+1) from the free area 504. Then, the memory control circuit unit 104 (or the memory management circuit 302) reads the first data from the lower physical programming units of the three temporary physical erasing units according to the sequence of writing the first data into the three temporary physical erasing units of the first temporary physical erasing unit group and simultaneously merges and writes the read first data into the upper, the middle and the lower physical programming units of the first physical erasing unit 510(F+1). Thereafter, the memory management circuit 302 maps the first logical unit to the first physical erasing unit 510(F+1).

Based on the above, in the present exemplary embodiment, the memory control circuit unit 104 (or the memory management circuit 302) decides whether to select temporary physical erasing units from the temporary area 506 or the free area 504 as the temporary physical erasing unit group according to the average erasing count and the predetermined thresholds of the physical erasing units of the temporary area 506. However, it should be noted that the values of the predetermined thresholds and the number of the physical erasing units correspondingly selected from the temporary area or the free area are not limited in the present invention. For example, a selecting method for the scenario where there is only one threshold and the temporary physical erasing unit corresponding thereto is also provided. When the average erasing count of the physical erasing units of the temporary area 506 is less or equal to the first predetermined threshold, three temporary physical erasing units of a temporary physical erasing unit group corresponding to one logical unit are all selected from the physical erasing units of the temporary area. When the average erasing count of the physical erasing units temporary area 506 is greater than the first predetermined threshold, three temporary physical erasing units of a temporary physical erasing unit group corresponding to a logical unit are all selected from the physical erasing units in the free area 504.

Second Embodiment

The steps of "data temporarily storing" and "data merging" operations of the second embodiment are similar to those in the first embodiment, and only the difference from the first embodiment will be described.

Only two thresholds are available for being used in the second embodiment. When the average erasing count of the physical erasing units of the temporary area is less than or equal to the first predetermined threshold, the memory control circuit unit 104 (or the memory management circuit 302) selects three physical erasing units from the temporary area as the three temporary physical erasing units in the first temporary physical erasing unit group corresponding to the first logical unit. When the average erasing count of the physical erasing units of the temporary area is greater than the first predetermined threshold and less than or equal to the second predetermined threshold, the memory control circuit unit 104 (or the memory management circuit 302) uses a random number module and a selected ratio of the temporary area to decide whether to selects three physical erasing units from the temporary area or the free area as the three temporary physical erasing units of the first temporary physical erasing unit group corresponding to the first logical unit. When the average erasing count of the physical erasing units of the temporary area is greater than the second predetermined threshold, the memory control circuit unit 104 (or the memory management circuit 302) selects three physical erasing units from the free area as the three temporary physical erasing units of the first temporary physical erasing unit group corresponding to the first logical unit.

Figure 10:
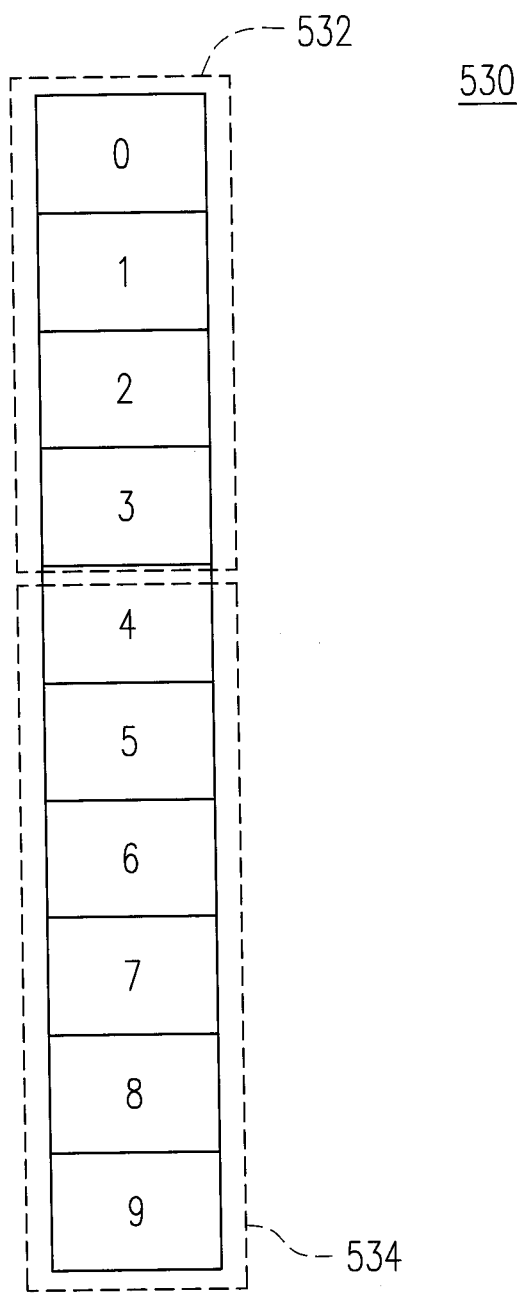
FIG. 10 is a schematic diagram illustrating a random number module according to an example of the second exemplary embodiment of the present invention.

FIG. 10 is a schematic diagram illustrating a random number module according to an example of the second exemplary embodiment of the present invention.

With reference to FIG. 10, a random number module 530 includes 10 values from 0 to 9. For instance, in the present exemplary embodiment, a selected ratio of the temporary area corresponding to the predetermined threshold is 2:3, and thus, the random number module 530 groups the 10 values into two groups (i.e., first values 532 and second values 534) according to the selected ratio of the temporary area. A ratio of a number of the first values 532 to a number of the second values 534 is 2:3. Referring to FIG. 10, the values 0 to 3 are grouped as the first values 532, and the values 4 to 9 are grouped as the second values 534, and the numbers of the two groups of values are 4 and 6, respectively. Namely, a ratio of the numbers of the two groups of values is 2:3 so as to correspond to the selected ratio of the temporary area, i.e., 2:3.

The memory control circuit unit 104 (or the memory management circuit 302) uses the random number module to randomly obtain a value from the first values and the second values and determines whether the randomly obtained value is one of the first values.

When the randomly obtained value is one of the first values, the memory control circuit unit 104 (or the memory management circuit 302) selects one physical erasing unit from the physical erasing units of the temporary area as one of the temporary physical erasing units of the first temporary physical erasing unit group corresponding to the first logical unit. When the obtained value is not any one of the first values (e.g., but is one of the second values), the memory control circuit unit 104 (or the memory management circuit 302) selects one physical erasing unit from the physical erasing units of the free area as another of the temporary physical erasing units of the first temporary physical erasing unit group corresponding to the first logical unit.

After selecting the three temporary physical erasing units from the first temporary physical erasing unit group corresponding to the first logical unit by using the random number module, the memory control circuit unit 104 (or the memory management circuit 302) sequentially writes the first data into lower physical programming units of the three temporary physical erasing units of the first temporary physical erasing unit group corresponding to the first logical unit to complete the "data temporarily storing" operation, and the follow-up "data merging" operation is the same as the first embodiment. It should be noted that the present invention is not intent to limit the selected ratio of the temporary area of the present exemplary embodiment, and the selected ratio of the temporary area may be set when being manufactured or may be set by firmware/software.

Third Embodiment

Being similar to the second embodiment, the third embodiment also uses a random number module corresponding to a selected ratio of the temporary area to select three temporary physical erasing units from the first temporary physical erasing unit group corresponding to the first logical unit. Being different from the second embodiment, in the third embodiment, no threshold is set, and the memory management circuit 302 calculated the selected ratio of the temporary area according to an average erasing count of all physical erasing units in the temporary area. Namely, the selected ratio of the temporary area dynamically varies with the value of the average erasing count, and each time before selecting the temporary physical erasing units from the temporary physical erasing unit group, the memory control circuit unit 104 (or the memory management circuit 302) determines whether to select the physical erasing units from the temporary area or the free area as the temporary physical erasing units of the temporary physical erasing unit group according to the random number module and the selected ratio of the temporary area as calculated.

To be more specific, in the third embodiment, the memory control circuit unit 104 (or the memory management circuit 302) records the average erasing count of the physical erasing units in the temporary area and performs the calculation according to the average erasing count and the maximum erasing count of the physical erasing units in the temporary area operated by using the single-page mode when being manufactured. In the present exemplary embodiment, a ratio of the difference of the maximum erasing count deducting the average erasing count of the physical erasing units of the temporary area to the average erasing count of the physical erasing units of the temporary area as calculated serves as the selected ratio of the temporary area. Certainly, the present invention is not limited to the aforementioned calculation.

For example, in the present exemplary embodiment, if assumed that the maximum erasing count of the physical erasing units in the temporary area operated by using the single-page mode is 3000 times and the average erasing count of the physical erasing units of the temporary area is 1500, the selected ratio of the temporary area is (3000−1500) to 1500, i.e., 1:1, while a ratio of the number of the first values to the number of the second values in the random number module is 1:1.

In an extreme case where the average erasing count of the physical erasing units of the temporary area is greater than or equal to the maximum erasing count, the selected ratio of the temporary area is 0:1, and thus, all the values in the random number module are grouped as the second values.

Nevertheless, in another extreme case where the average erasing count of the physical erasing units of the temporary area is 0, the selected ratio of the temporary area is 1:0, and thus, all the values in the random number module are grouped as the first values.

For example, the values of the random number module may also be set as 1 to 3000 values according to the maximum erasing count, i.e., 3000, of the physical erasing units of the temporary area, where the number of the first values is equal to the maximum erasing count deducting the average erasing count, i.e., 1500. Namely, the $1^{st}$ to the $1500^{th}$ values are grouped as the first values, and the $1501^{st}$ to the $3000^{th}$ values of are grouped as the second values. Nevertheless, the present invention is not intent to limit the setting manner of the random number module. For instance, in other exemplary embodiments, the number of the values in the random number module is the maximum erasing count of the physical erasing units of the temporary area, and the number of the first values is the average erasing count as calculated, such that the values in the random number module that are not grouped as the first values are the second values. When the value randomly obtained by using the random number module belongs to the first values, the memory control circuit unit 104 (or the memory management circuit 302) selects physical erasing units from the free area as the temporary physical erasing units, and when the value randomly obtained by using the random number module belongs to the second values, the memory control circuit unit 104 (or the memory management circuit 302) selects physical erasing units from the temporary area as temporary physical erasing units.

Thereafter, the memory control circuit unit 104 (or the memory management circuit 302) uses the random number module to select the temporary physical erasing units for the "data temporarily storing" operation and the follow-up "data merging" operation. In the present exemplary embodiment, the selected ratio of the temporary area is dynamically adjusted according to the average erasing count of the temporary area. When the average erasing count of the physical erasing units in the temporary area is low, the memory control circuit unit 104 (or the memory management circuit 302) selects physical erasing units from the temporary area as the temporary physical erasing units. On the other hand, when the average erasing count of the physical erasing units in the temporary area is high, i.e., the physical erasing units in the temporary area gets old, the memory control circuit unit 104 (or the memory management circuit 302) gradually selects physical erasing units from the free area as the temporary physical erasing units. By doing so, unrecoverable data error due to old physical erasing units of the temporary area serving as the temporary physical erasing units for the "data temporarily storing" operation can be avoided.

Figure 11:
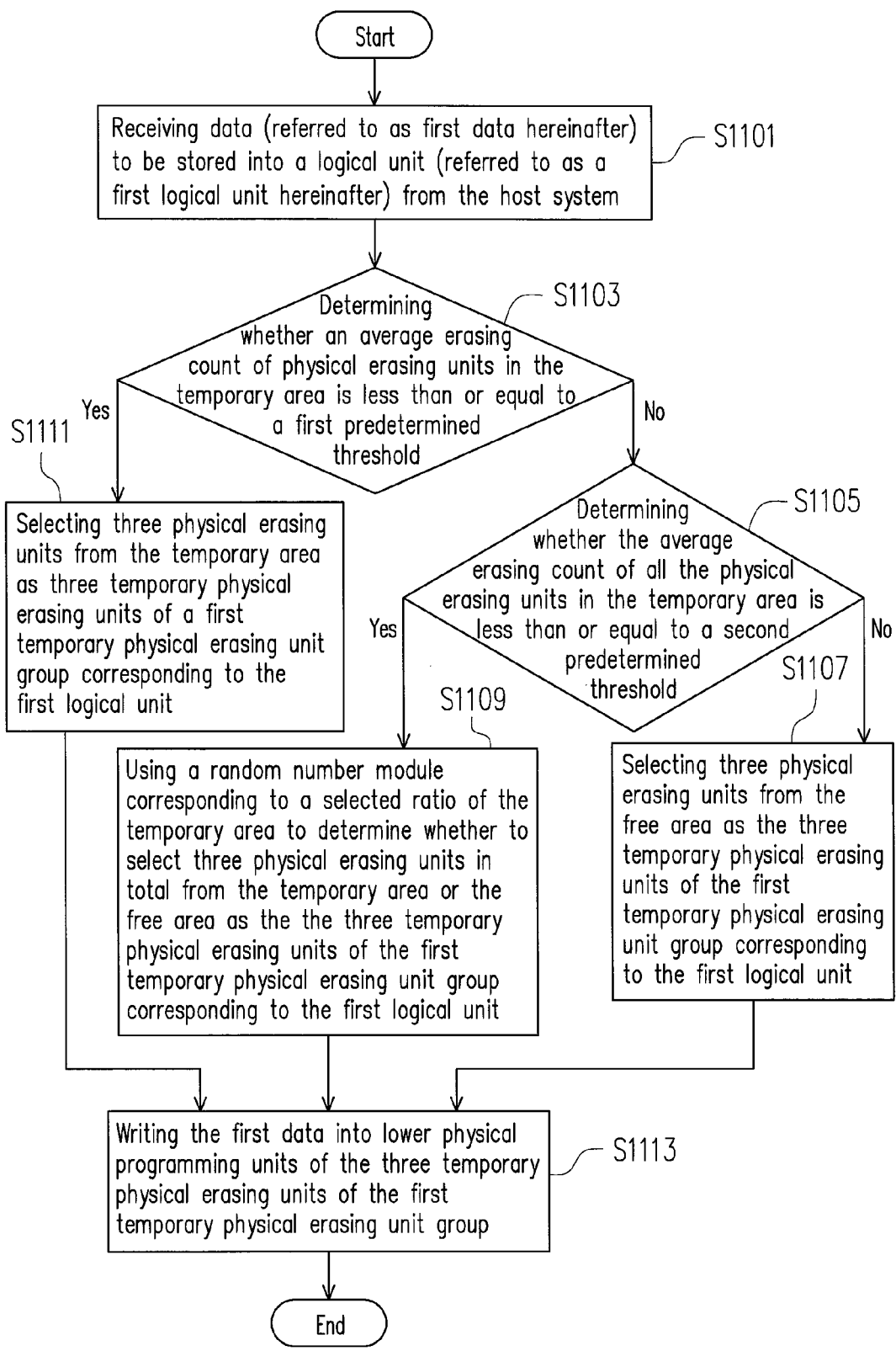
FIG. 11 is a flowchart of a data writing method according to an exemplary embodiment of the present invention.

FIG. 11 is a flowchart of a data writing method according to an exemplary embodiment of the present invention.

With reference to FIG. 11, in step S1101, the memory control circuit unit 104 (or the memory management circuit 302) receives data (referred to as first data hereinafter) to be stored into a logical unit (referred to as a first logical unit hereinafter) from the host system 1000.

In step S1103, the memory control circuit unit 104 (or the memory management circuit 302) determines whether an average erasing count of physical erasing units in the temporary area 506 is less than or equal to a first predetermined threshold.

If the average erasing count of all the physical erasing units in the temporary area 506 is less than or equal to the first predetermined threshold, in step S1111, the memory control circuit unit 104 (or the memory management circuit 302) selects three physical erasing units from the temporary area 506 as three temporary physical erasing units of a first temporary physical erasing unit group corresponding to the first logical unit.

If the average erasing count of all the physical erasing units in the temporary area 506 is greater than the first predetermined threshold, in step S1105, the memory control circuit unit 104 (or the memory management circuit 302) determines whether the average erasing count of all the physical erasing units in the temporary area 506 is less than or equal to a second predetermined threshold.

If the average erasing count of all the physical erasing units in the temporary area 506 is greater than the second predetermined threshold, in step S1107, the memory control circuit unit 104 (or the memory management circuit 302) selects three physical erasing units from the free area 504 as the three temporary physical erasing units of the first temporary physical erasing unit group corresponding to the first logical unit.

If the average erasing count of all the physical erasing units in the temporary area 506 is greater than the first predetermined threshold and less than or equal to the second predetermined threshold, in step S1109, the memory control circuit unit 104 (or the memory management circuit 302) uses the random number module 530 corresponding to a selected ratio of the temporary area to determine whether to select three physical erasing units from the temporary area 506 or the free area 504 as the three temporary physical erasing units of the first temporary physical erasing unit group corresponding to the first logical unit.

In steps S1107, S1109 and S1111, after selecting the three physical erasing units from the temporary area 506 or the free area 504 as the three temporary physical erasing units of the first temporary physical erasing unit group corresponding to the first logical unit, in step S1113, the memory control circuit unit 104 (or the memory management circuit 302) writes the first data into lower physical programming units of the three temporary physical erasing units of the first temporary physical erasing unit group to end the data temporarily storing operation of the first data.

Figure 12:
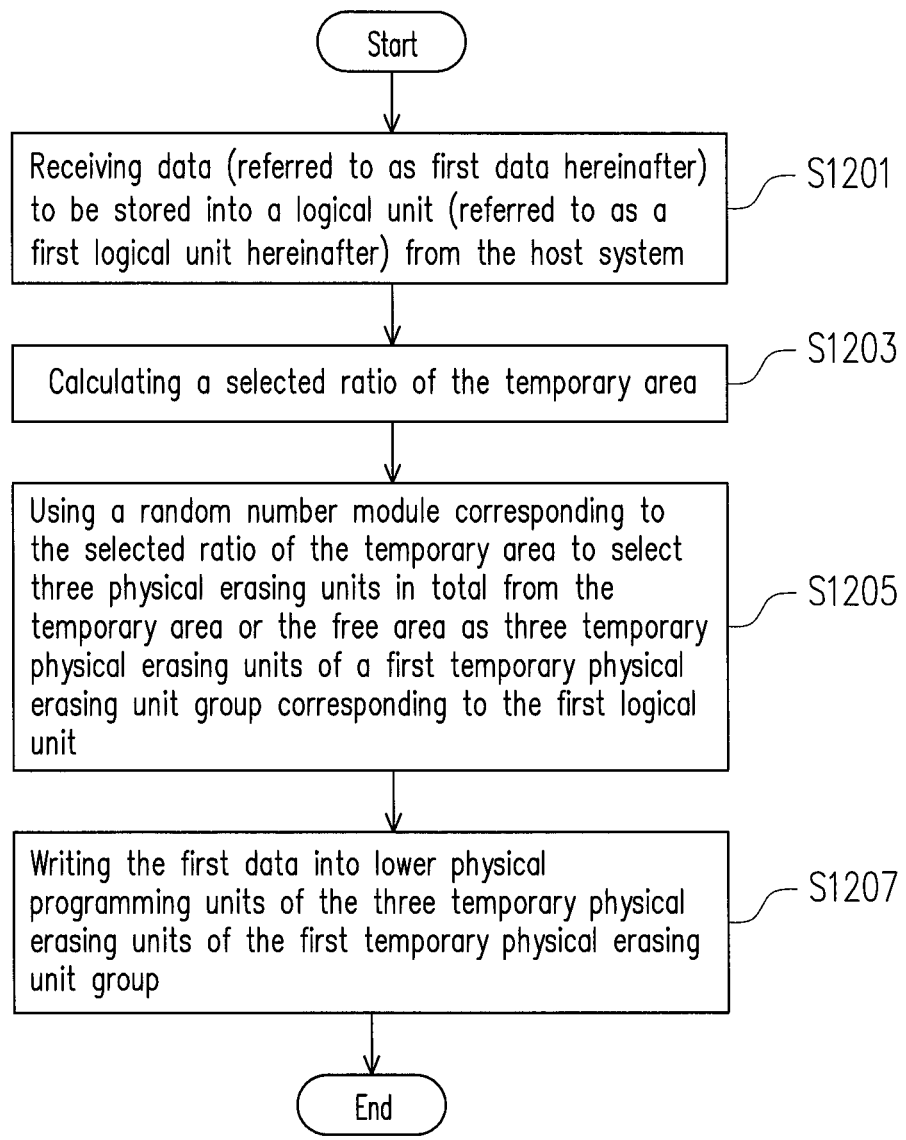
FIG. 12 is a flowchart of a data writing method according to another exemplary embodiment of the present invention.

FIG. 12 is a flowchart of a data writing method according to another exemplary embodiment of the present invention.

With reference to FIG. 12, in step S1201, the memory control circuit unit 104 (or the memory management circuit 302) receives data (referred to as first data hereinafter) to be written into a logical unit (referred to as a first logical unit hereinafter) from the host system 1000.

Then, in step S1203, the memory control circuit unit 104 (or the memory management circuit 302) calculates a selected ratio of the temporary area 506. Although the present invention does not limit the manner for calculating the selected ratio of the temporary area, the calculated selected ratio of the temporary area dynamically varies with the increase of the average erasing count of the temporary area 506. Namely, no matter how the dynamically varying selected ratio of the temporary area is calculated, the memory control circuit unit 104 (or the memory management circuit 302) reduce a ratio of the physical erasing units selected from the temporary area as the temporary physical erasing units of the temporary physical erasing unit group when the average erasing count of the temporary area 506 is increased so as to achieve mitigation of the speed of the physical erasing units of the temporary area getting old.

Then, in step S1205, the memory control circuit unit 104 (or the memory management circuit 302) uses a random number module corresponding to the selected ratio of the temporary area to select three physical erasing units in total from the temporary area or the free area as three temporary physical erasing units of a first temporary physical erasing unit group corresponding to the first logical unit.

After selecting the three physical erasing units from the temporary area 506 or the free area 504 as the three temporary physical erasing units of the first temporary physical erasing unit group corresponding to the first logical unit, in step S1207, the memory control circuit unit 104 (or the memory management circuit 302) writes the first data into lower physical programming units of the three temporary physical erasing units of the first temporary physical erasing unit group to end the data temporarily storing operation of the first data.

It is to be mentioned that in the present embodiment, after the step of copying the first data to the first physical erasing unit, the memory control circuit unit 104 (or the memory management circuit 302) associates the physical erasing units selected from the temporary area as the temporary physical erasing units of the first temporary physical erasing unit group back with the temporary area and associates the physical erasing units selected from the free area as the temporary physical erasing units of the first temporary physical erasing unit group back with the free area. Namely, after the "data merging" operation, the used temporary physical erasing units may be returned to the temporary area or the free area where they are originally from so as to be used as the physical erasing units in the temporary area or the free area like the war they used to be. For instance, the physical erasing units associated back with the free area together with physical erasing units in the data area may be used for a wear leveling procedure so as to increase the lifespan of the physical erasing units in the data area and to improve the stability.

In conclusion of the above description with respect to the exemplary embodiments of the invention, the selected ratio of the physical erasing units of the temporary area may be dynamically adjusted to avoid data error due to selecting old physical erasing units from the temporary area for the data temporarily storing operation when the physical erasing units of the temporary area is already old. Additionally, the data to be written by the host system is temporarily stored in the temporary physical erasing unit group operated by using the single-page mode. Thus, the data writing method, the memory control circuit unit and the memory storage apparatus of the invention can effectively improve the speed of data writing to prevent host timeout due to the slower writing speed of the TLC. Moreover, since the data to be written is temporarily stored in the temporary physical erasing unit group and then programmed to the physical erasing units in the data area by using the physical programming units (i.e., the lower physical programming units, the middle physical programming units and the upper physical programming units composed of a plurality of memory cells on the same word line) as units, the reliability of data storing can be effectively improved. In particular, if the host system continuously repeats writing data into the same logical unit, the data writing method, the memory control circuit unit and the memory storage apparatus of the invention facilitates in effectively reducing the wear of the physical erasing units in the data area since the data is updated in the temporary area. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method for a rewritable non-volatile memory module, wherein the rewritable non-volatile memory module has a plurality of physical erasing units and each of the physical erasing units has a plurality of physical programming units, the data writing method comprising:
   at least partitioning the physical erasing units into a free area and a temporary area, wherein data is written into the physical erasing units of the temporary area by using a single-page mode;
   receiving first data to be stored into a plurality of logical sub-units of a first logical unit;
   selecting physical erasing units from the plurality of physical erasing units of the temporary area, the free area or both the temporary area and the free area as a plurality of temporary physical erasing units of a first temporary physical erasing unit group corresponding to the first logical unit according to an average erasing count of the physical erasing units of the temporary area;
   writing the first data into the temporary physical erasing units of the first temporary physical erasing unit group by using the single-page mode; and
   selecting a first physical erasing unit from the physical erasing units of the free area, copying the first data from the temporary physical erasing units of the first temporary physical erasing unit group to the first physical erasing unit and mapping the first logical unit to the first physical erasing unit.

2. The data writing method according to claim 1, wherein the first data is written into a lower physical programming unit and an upper physical programming unit of the physical programming units belonging to the first physical erasing unit and the lower physical programming unit and the upper physical programming unit of the physical programming units belonging to the first physical erasing unit are programmed simultaneously or in phases.

3. The data writing method according to claim 1, wherein the step of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area comprises:
   determining whether the average erasing count of the physical erasing units of the temporary area is less than a first predetermined threshold; and
   if the average erasing count of the physical erasing units of the temporary area is less than the first predetermined threshold, only selecting the physical erasing units from the physical erasing units of the temporary area as the temporary physical erasing units of the first temporary physical erasing unit group corresponding to the first logical unit.

4. The data writing method according to claim 1, wherein the step of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area comprises:
   determining whether the average erasing count of the physical erasing units of the temporary area is greater than a second predetermined threshold; and
   if the average erasing count of the physical erasing units of the temporary area is greater than the second predetermined threshold, only selecting the physical erasing units from the physical erasing units of the free area as the temporary physical erasing units of the first temporary physical erasing unit group corresponding to the first logical unit.

5. The data writing method according to claim 1, wherein the step of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area further comprises:
   if the average erasing count of the physical erasing units of the temporary area is between a first predetermined threshold and a second predetermined threshold, selecting at least one physical erasing unit from the physical erasing units of the temporary area as a portion of the temporary physical erasing units of the first temporary physical erasing unit group corresponding to the first logical unit and selecting at least one physical erasing unit from the physical erasing units of the free area as the other portion of the temporary physical erasing units of the first temporary physical erasing unit group corresponding to the first logical unit.

6. The data writing method according to claim 1, wherein the step of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area comprises:
   calculating a selected ratio of the temporary area according to the average erasing count of the physical erasing units of the temporary area;
   establishing a random number module, wherein the random number module is composed of a plurality of first values and a plurality of second values, and a ratio of the number of the first values to the number of the second values is equal to the selected ratio of the temporary area;
   randomly obtaining a value from the first values and the second values of the random number module and determining whether the value is one of the first values;
   if the obtained value is one of the first values, selecting one physical erasing unit from the physical erasing units of the temporary area as one of the temporary physical erasing units of the first temporary physical erasing unit group corresponding to the first logical unit; and
   if the obtained value is not any one of the first values, selecting one physical erasing unit from the physical erasing units of the free area as another one of the temporary physical erasing units of the first temporary physical erasing unit group corresponding to the first logical unit.

7. The data writing method according to claim 1, wherein the physical erasing units of the free area and the physical erasing units of the temporary area are operated independently from each other.

8. The data writing method according to claim 1, further comprising: after the step of copying the first data to the first physical erasing unit, associating the physical erasing units selected from the temporary area as the temporary physical erasing units of the first temporary physical erasing unit group back with the temporary area and associating the physical erasing units selected from the free area as the temporary physical erasing units of the first temporary physical erasing unit group back with the free area.

9. The data writing method according to claim 3, wherein the step of only selecting the physical erasing units from the physical erasing units of the temporary area as the temporary physical erasing units of the first temporary physical erasing unit group corresponding to the first logical unit comprises:
  selecting three physical erasing units from the physical erasing units of the temporary area as a first temporary physical erasing unit, a second temporary physical erasing unit and a third temporary physical erasing unit of the first temporary physical erasing unit group corresponding to the first logical unit.

10. The data writing method according to claim 4, wherein the step of only selecting the physical erasing units from the physical erasing units of the free area as the temporary physical erasing units of the first temporary physical erasing unit group corresponding to the first logical unit comprises:
  selecting three physical erasing units from the physical erasing units of the free area as a first temporary physical erasing unit, a second temporary physical erasing unit and a third temporary physical erasing unit of the first temporary physical erasing unit group corresponding to the first logical unit.

11. The data writing method according to claim 5, wherein the step of selecting the at least one physical erasing unit from the physical erasing units of the temporary area as the portion of the temporary physical erasing units of the first temporary physical erasing unit group corresponding to the first logical unit and selecting the at least one physical erasing unit from the physical erasing units of the free area as the other portion of the temporary physical erasing units of the first temporary physical erasing unit group corresponding to the first logical unit comprises:
  selecting one physical erasing unit from the physical erasing units of the temporary area as a first temporary physical erasing unit of the first temporary physical erasing unit group corresponding to the first logical unit; and
  selecting two physical erasing units from the physical erasing units of the free area as a second temporary physical erasing unit and a third temporary physical erasing unit of the first temporary physical erasing unit group corresponding to the first logical unit.

12. The data writing method according to claim 5, wherein the step of selecting the at least one physical erasing unit from the physical erasing units of the temporary area as the portion of the temporary physical erasing units of the first temporary physical erasing unit group corresponding to the first logical unit and selecting the at least one physical erasing unit from the physical erasing units of the free area as the other portion of the temporary physical erasing units of the first temporary physical erasing unit group corresponding to the first logical unit comprises:
  selecting two physical erasing units from the physical erasing units of the temporary area as a first temporary physical erasing unit and a second temporary physical erasing unit of the first temporary physical erasing unit group corresponding to the first logical unit; and
  selecting one physical erasing unit from the physical erasing units of the free area as a third temporary physical erasing unit of the first temporary physical erasing unit group corresponding to the first logical unit.

13. A memory control circuit unit, for controlling a rewritable non-volatile memory module, the memory control circuit unit comprising:
  a host interface, configured to be coupled to a host system;
  a memory interface, configured to be coupled to the rewritable non-volatile memory module, wherein the rewritable non-volatile memory module has a plurality of physical erasing units, and each of the physical erasing units has a plurality of physical programming units; and
  a memory management circuit, coupled to the host interface and the memory interface and configured to at least partition the physical erasing units into a free area and a temporary area, wherein data is written into the physical erasing units of the temporary area by using a single-page mode,
  wherein the memory management circuit is further configured to receive first data from the host system, and the host system instructs to store the first data to a plurality of logical sub-units of a first logical unit,
  wherein the memory management circuit is further configured to select physical erasing units from the plurality of physical erasing units of the temporary area, the free area or both the temporary area and the free area as a plurality of temporary physical erasing units of a first temporary physical erasing unit group corresponding to the first logical unit according to an average erasing count of the physical erasing units of the temporary area,
  wherein the memory management circuit is further configured to write the first data into the temporary physical erasing units of the first temporary physical erasing unit group in the single-page mode,
  wherein the memory management circuit is further configured to select a first physical erasing unit from the physical erasing units of the free area, copy the first data from the temporary physical erasing units of the first temporary physical erasing unit group to the first physical erasing unit and map the first logical unit to the first physical erasing unit.

14. The memory control circuit unit according to claim 13, wherein in the operation of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area, the memory management circuit is further configured to determine whether the average erasing count of the physical erasing units of the temporary area is less than a first predetermined threshold,
  wherein if the average erasing count of the physical erasing units of the temporary area is less than the first predetermined threshold, the memory management circuit only selects the physical erasing units from the physical erasing units of the temporary area as the temporary physical erasing units of the first temporary physical erasing unit group corresponding to the first logical unit.

15. The memory control circuit unit according to claim 13, wherein in the operation of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area, the memory management circuit is further configured to determine whether the average erasing count of the physical erasing units of the temporary area is greater than a second predetermined threshold, wherein if the average erasing count of the physical erasing units of the temporary area is greater than the second predetermined threshold, the memory management circuit only selects the physical erasing units from the physical erasing units of the free area as the temporary physical erasing units of the first temporary physical erasing unit group corresponding to the first logical unit.

16. The memory control circuit unit according to claim 13, wherein in the operation of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area, if the average erasing count of the physical erasing units of the temporary area is between a first predetermined threshold and a second predetermined threshold, the memory management circuit selects at least one physical erasing unit from the physical erasing units of the temporary area as a portion of the temporary physical erasing units of the first temporary physical erasing unit group corresponding to the first logical unit and selects at least one physical erasing unit from the physical erasing units of the free area as the other portion of the temporary physical erasing units of the first temporary physical erasing unit group corresponding to the first logical unit.

17. The memory control circuit unit according to claim 13, wherein the memory management circuit is further configured to calculate a selected ratio of the temporary area according to the average erasing count of the physical erasing units of the temporary area and establish a random number module, wherein the random number module is composed of a plurality of first values and a plurality of second values, and a ratio of the number of the first values to the number of the second values is equal to the selected ratio of the temporary area, wherein in the operation of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area, the memory management circuit randomly obtains a value from the first values and the second values of the random number module and determines whether the value is one of the first values, wherein if the randomly obtained value is one of the first values, the memory management circuit selects one physical erasing unit from the physical erasing units of the temporary area as one of the temporary physical erasing units of the first temporary physical erasing unit group corresponding to the first logical unit, wherein if the obtained value is not any one of the first values, the memory management circuit selects one physical erasing unit from the physical erasing units of the free area as another one of the temporary physical erasing units of the first temporary physical erasing unit group corresponding to the first logical unit.

18. The memory control circuit unit according to claim 13, wherein after copying the first data to the first physical erasing unit, the memory management circuit further associates the physical erasing units selected from the temporary area as the temporary physical erasing units of the first temporary physical erasing unit group back with the temporary area and associates the physical erasing units selected from the free area as the temporary physical erasing units of the first temporary physical erasing unit group back with the free area.

19. A memory storage apparatus, comprising:

a connection interface unit, configured to be coupled to a host system;

a rewritable non-volatile memory module, having a plurality of physical erasing units, and each of the physical erasing units having a plurality of physical programming units; and a memory control circuit unit, coupled to the connection interface unit and the rewritable non-volatile memory module and configured to at least partition the physical erasing units into a free area and a temporary area, wherein data is written into the physical erasing units of the temporary area by using a single-page mode, wherein the memory control circuit unit is further configured to receive first data from the host system, and the host system instructs to store the first data to a plurality of logical sub-units of a first logical unit, wherein the memory control circuit unit is further configured to select physical erasing units from the plurality of physical erasing units of the temporary area, the free area or both the temporary area and the free area as a plurality of temporary physical erasing units of a first temporary physical erasing unit group corresponding to the first logical unit according to an average erasing count of the physical erasing units of the temporary area, wherein the memory control circuit unit is further configured to write the first data into the temporary physical erasing units of the first temporary physical erasing unit group in the single-page mode, wherein the memory control circuit unit is further configured to select a first physical erasing unit from the physical erasing units of the free area, copy the first data from the temporary physical erasing units of the first temporary physical erasing unit group to the first physical erasing unit and map the first logical unit to the first physical erasing unit.

20. The memory storage apparatus according to claim 19, wherein in the operation of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area, the memory control circuit unit is further configured to determine whether the average erasing count of the physical erasing units of the temporary area is less than a first predetermined threshold, wherein if the average erasing count of the physical erasing units of the temporary area is less than the first predetermined threshold, the memory control circuit unit only selects the physical erasing units from the physical erasing units of the temporary area as the temporary physical erasing units of the first temporary physical erasing unit group corresponding to the first logical unit.

21. The memory storage apparatus according to claim 19, wherein in the operation of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area, the memory control circuit unit is further configured to determine whether the average erasing count of the physical erasing units of the temporary area is greater than a second predetermined threshold, wherein if the average erasing count of the physical erasing units of the temporary area is greater than the second predetermined threshold, the memory control circuit unit only selects the physical erasing units from the physical erasing units of the free area as the temporary physical erasing units of the first temporary physical erasing unit group corresponding to the first logical unit.

22. The memory storage apparatus according to claim 19, wherein in the operation of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area, if the average erasing count of the physical erasing units of the temporary area is between a first predetermined threshold and a second predetermined threshold, the memory control circuit unit selects at least one physical erasing unit from the physical erasing units of the temporary area as a portion of the temporary physical erasing units of the first temporary physical erasing unit group corresponding to the first logical unit and selects at least one physical erasing unit from the physical erasing units of the free area as the other portion of the temporary physical erasing units of the first temporary physical erasing unit group corresponding to the first logical unit.

23. The memory storage apparatus according to claim 19, wherein the memory control circuit unit is further configured to calculate a selected ratio of the temporary area according to the average erasing count of the physical erasing units of the temporary area and establish a random number module, wherein the random number module is composed of a plurality of first values and a plurality of second values, and a ratio of the number of the first values to the number of the second values is equal to the selected ratio of the temporary area, wherein in the operation of selecting the physical erasing units from the plurality of physical erasing units of the temporary area, the free area or both the temporary area and the free area as the plurality of temporary physical erasing units of the first temporary physical erasing unit group corresponding to the first logical unit according to the average erasing count of the physical erasing units of the temporary area, the memory control circuit unit obtains a value from the first values and the second values of the random number module and determines whether the randomly obtained value is one of the first values, wherein if the obtained value is one of the first values, the memory control circuit unit selects one physical erasing unit from the physical erasing units of the temporary area as one of the temporary physical erasing units of the first temporary physical erasing unit group corresponding to the first logical unit, wherein if the obtained value is not any one of the first values, the memory control circuit unit selects one physical erasing unit from the physical erasing units of the free area as another one of the temporary physical erasing units of the first temporary physical erasing unit group corresponding to the first logical unit.

24. The memory storage apparatus according to claim 19, wherein after copying the first data to the first physical erasing unit, the memory control circuit unit further associates the physical erasing units selected from the temporary area as the temporary physical erasing units of the first temporary physical erasing unit group back with the temporary area and associates the physical erasing units selected from the free area as the temporary physical erasing units of the first temporary physical erasing unit group back with the free area.

\* \* \* \* \*